US007307045B2

(12) United States Patent
Kawai et al.

(10) Patent No.: US 7,307,045 B2
(45) Date of Patent: Dec. 11, 2007

(54) SIGNAL SWITCHING DEVICE

(75) Inventors: Kunihiro Kawai, Yokohama (JP); Daisuke Koizumi, Zushi (JP); Kei Satoh, Yokosuka (JP); Shoichi Narahashi, Yokohama (JP); Tetsuo Hirota, Kanazawa (JP)

(73) Assignee: NTT DoCoMo, Inc., Tokyo (JP)

( * ) Notice: Subject to any disclaimer, the term of this patent is extended or adjusted under 35 U.S.C. 154(b) by 642 days.

(21) Appl. No.: 10/702,573

(22) Filed: Nov. 7, 2003

(65) Prior Publication Data

US 2004/0097379 A1 May 20, 2004

(30) Foreign Application Priority Data

Nov. 7, 2002 (JP) ............................. 2002-324422
Jan. 23, 2003 (JP) ............................. 2003-015351

(51) Int. Cl.
*H01B 12/02* (2006.01)
*H01L 39/12* (2006.01)
*H04B 1/00* (2006.01)

(52) U.S. Cl. ...................... 505/100; 505/856; 505/866; 505/703; 333/161; 333/99 S; 338/325

(58) Field of Classification Search ................ 505/100, 505/703, 856, 866; 333/99 S; 338/325
See application file for complete search history.

(56) References Cited

U.S. PATENT DOCUMENTS 4,831,421 A * 5/1989 Gallagher et al. ............ 257/34
5,105,200 A * 4/1992 Koepf ................. 343/700 MS
5,116,807 A 5/1992 Romanofsky et al.
5,350,739 A 9/1994 Martens et al.
5,841,342 A 11/1998 Hegmann et al.
6,963,758 B2 * 11/2005 Narahashi et al. .......... 455/561

FOREIGN PATENT DOCUMENTS

| | | | |
|---|---|---|---|
| JP | 1-174101 | | 7/1989 |
| JP | 1-183864 | | 7/1989 |
| JP | 1-305602 | | 12/1989 |
| JP | 09-275302 | | 10/1997 |
| JP | 10-65411 | | 3/1998 |
| JP | 10-135715 | | 5/1998 |
| JP | 10-224269 | * | 8/1998 |
| JP | 2001-127351 | | 5/2001 |

* cited by examiner

*Primary Examiner*—Mark Kopec
*Assistant Examiner*—Kallambella Vijayakumar
(74) *Attorney, Agent, or Firm*—Oblon, Spivak, McClelland, Maier & Neustadt, P.C.

(57) ABSTRACT

A signal switching device is disclosed that is capable of transmitting signals with less signal loss while securing a good isolation characteristic. The signal switching device includes a first section formed from a superconducting material connected to a first transmission path. The first section has a smaller cross section at the input end than at the output end or, the signal switching device may include a first section formed from a superconducting material connected to a first transmission path in series, and a second section formed from a superconducting material connected to a second transmission path in parallel. The cross section of the second section is smaller than that of the second transmission path. The length of the second transmission path is determined in such a way that an input impedance of the second transmission path is sufficiently large when the second section is in a superconducting state.

12 Claims, 21 Drawing Sheets

SIGNAL SWITCHING DEVICE

BACKGROUND OF THE INVENTION

1. Field of the Invention

The present invention generally relates to a high frequency circuit, in particular, to a signal switching device that switches a transmission path to which an input signal propagates.

2. Description of the Related Art

In radio base stations, transponders, or other communication equipment used in cellular communications or satellite communications, signal switching devices are utilized for appropriately switching transmission paths of input signals. Such a signal switching device receives high frequency signals from an input circuit, selects a desired transmission path from a number of available transmission paths, and outputs the signals through the selected transmission path.

Japanese Laid Open Patent Application No. 9-275302 discloses a microwave switch, in which each of a number of micro-strip paths connected to a switching section have a part made from an oxide superconducting material, and a direct current element is provided between the switching section and the oxide superconducting part to change the oxide superconducting part from a superconducting state to a non-super conducting state (for example, a normal conducting state), or vice versa. Because of such a configuration, leakage of the microwave to the non-selected paths is reduced, improving the isolation characteristic of the microwave switch.

However, when the above technique is used to improve the isolation characteristic, degradation of signals entering the desired transmission path and loss of levels of the signals are not always reduced. In some cases, even when the leakage from the input signals to the unselected transmission paths (specifically, later stages of the paths) is zero, the signals entering the selected transmission path are strongly degraded compared to the input signals because of the length of the transmission path or other reasons. Therefore, for good quality of signal switching, not only the isolation characteristic but also the signal degradation should be considered. The related art cannot meet this requirement.

In the above signal switching device, a switching element, such as a mechanical switch or a semiconductor switch, is provided at the output of each transmission path, that is, each output of the switching device. These elements are also for preventing signals from entering the later stage circuits so as to improve the isolation characteristic. However, the reliability of a mechanical switch declines due to its switching mechanism. Although the problem related to the mechanical switch is avoidable by using a semiconductor switch, the isolation characteristic of a semiconductor switch is not as good as that of the mechanical switch. In addition, the reliability of the operation of the semiconductor switch itself has to be a concern. Further, when using the above switches, appropriate signals for controlling their switching operations have to be generated and devices capable of switching operations according to the control signals have to be configured, making a signal switching device complicated.

SUMMARY OF THE INVENTION

Accordingly, it is a general object of the present invention to solve one or more problems of the related art by providing a signal switching device capable of transmitting signals with less signal loss while maintaining a good isolation characteristic.

A more specific object of the present invention is to provide a signal switching device capable of transmitting signals with less signal loss while maintaining a good isolation characteristic without being connected with a switching element such as a mechanical switch or a semiconductor switch.

According to a first aspect of the present invention, there is provided a signal switching device that includes a plurality of transmission paths connected to an input path, and outputs a signal from the input path through one of the transmission paths. The signal switching device comprises a first variable impedance unit connected to a first transmission path of the transmission paths. The first variable impedance unit includes a first section formed from a superconducting material. The first section is set to a superconducting state when the signal is to be output through the first transmission path, and set to a non-superconducting state when the signal is to be output through a second transmission path. The first section includes a portion of a predetermined length at its input end, and this portion has a smaller cross section than that of the output end of the first section. For example, the width of the portion is less than that of the first section at the output end. Alternatively, the thickness of the portion is less than that of the first section at the output end.

Preferably, when the signal is to be output through the first transmission path, the second transmission path is adjusted to have an input impedance greater than a predetermined value.

The signal switching device may further comprise a selection unit to select the desired transmission path. For example, the selection unit may select the first transmission path as the desired transmission path by changing the conduction state of the superconducting material of the first section.

According to the present invention, by providing a first section formed by a superconducting material connected to the first transmission path, when switching input signals to the second transmission path, the first section in the first transmission path formed by a superconducting material is set to a non-superconducting state. Because a portion at the input end of the first section has a smaller cross section than that of the output end of the first section, the resistance of the first transmission path becomes very large in the non-superconducting state. Consequently, a good isolation characteristic can be achieved; furthermore, signal loss occurring in the first transmission path can be reduced effectively.

According to a second aspect of the present invention, there is provided a signal switching device that includes a plurality of transmission paths connected to an input path, and outputs a signal from the input path through one of the transmission paths. The signal switching device comprises a first variable impedance unit connected to a first transmission path in series and a second variable impedance unit provided on a second transmission path in parallel to a signal line of the second transmission path. The first variable impedance unit includes a first section formed from a superconducting material. The second variable impedance unit includes a second section formed from a superconducting material, and the cross section of the second section is smaller than that of the signal line of the second transmission path. The length of the signal line of the second transmission path is determined in such a way that an input impedance of the second transmission path is sufficiently large when the second section is in a superconducting state.

In one embodiment of the present invention, the length of the second section is adjusted so that an input impedance from the second transmission path to the second section is sufficiently small when the second section is in a superconducting state. For example, the length of the second section equals half of a wavelength of the input signal, or a multiple of half of the wavelength of the signal. Alternatively, the length of the second section equals a quarter of a wavelength of the signal or an odd multiple of a quarter of the wavelength of the signal.

The signal switching device may further comprise a selection unit to select the desired transmission path. For example, the selection unit selects the first transmission path or the second transmission path as the desired transmission path by changing conduction states of the superconducting materials of the first section and the second section.

In one embodiment of the present invention, the signal switching device may further comprise a third variable impedance unit connected to a third transmission path in series and a fourth variable impedance unit provided on the third transmission path in parallel to a signal line of the third transmission path. The third variable impedance unit includes a third section formed from a superconducting material, and the fourth variable impedance unit includes a fourth section formed from a superconducting material. An area of the cross section of the fourth section is less than that of the cross section of the signal line of the third transmission path, and the length of the signal line of the third transmission path is determined in such a way that an input impedance of the third transmission path is sufficiently large when the fourth section is in a superconducting state.

Preferably, when the fourth section is in the superconducting state, the length of the fourth section is adjusted so that an input impedance from the third transmission path to the fourth section is sufficiently small. For example, one end of the fourth section is connected to the third transmission path, and another end of the fourth section is grounded, and the length of the fourth section equals half of a wavelength of the signal, or a multiple of half of the wavelength of the signal. Alternatively, one end of the fourth section is connected to the third transmission path, and another end of the fourth section is open, and the length of the fourth section equals a quarter of a wavelength of the signal or an odd multiple of a quarter of the wavelength of the signal.

The signal switching device may further comprise a selection unit to select the desired transmission path, for example, from the first, the second and the third transmission paths by changing conduction states of the superconducting materials of the first section, the second section, the third section, and the fourth section.

According to the present invention, by providing a second section formed from a superconducting material on the second transmission path in parallel, it is possible to appropriately control signal transmission to the subsequent circuits connected to the second transmission path without using mechanical switches or semiconductor switches.

Because of the first section connected to the first transmission path in series, and the second section connected to the second transmission path in parallel, when switching the input signals to the first transmission path, the first section and the second section are both in the superconducting state. Because the length of the second transmission path is determined such that the input impedance to the second transmission path is sufficiently large, input signals propagate to the first transmission path with extremely low signal loss to the second transmission path.

When switching the input signals to the second transmission path, the first section and the second section are both in the non-superconducting state. Therefore, the impedance of the first transmission path is very large, and input signals propagate to the second transmission path with extremely low signal loss to the first transmission path. Further, because the cross section of the second section connected to the second transmission path in parallel is very small, the impedance to the second section is very large, hence the signals propagating in the second transmission path continue to propagate to the circuits connected to the second transmission path with little signals being branched by the second section. Consequently, a good isolation characteristic can be achieved, and signal loss occurring in the either transmission path can be reduced effectively.

These and other objects, features, and advantages of the present invention will become more apparent from the following detailed description of the preferred embodiments given with reference to the accompanying drawings.

DESCRIPTION OF THE PREFERRED EMBODIMENTS

Below, preferred embodiments of the present invention are explained with reference to the accompanying drawings.

First Embodiment

First Example

Figure 1A:
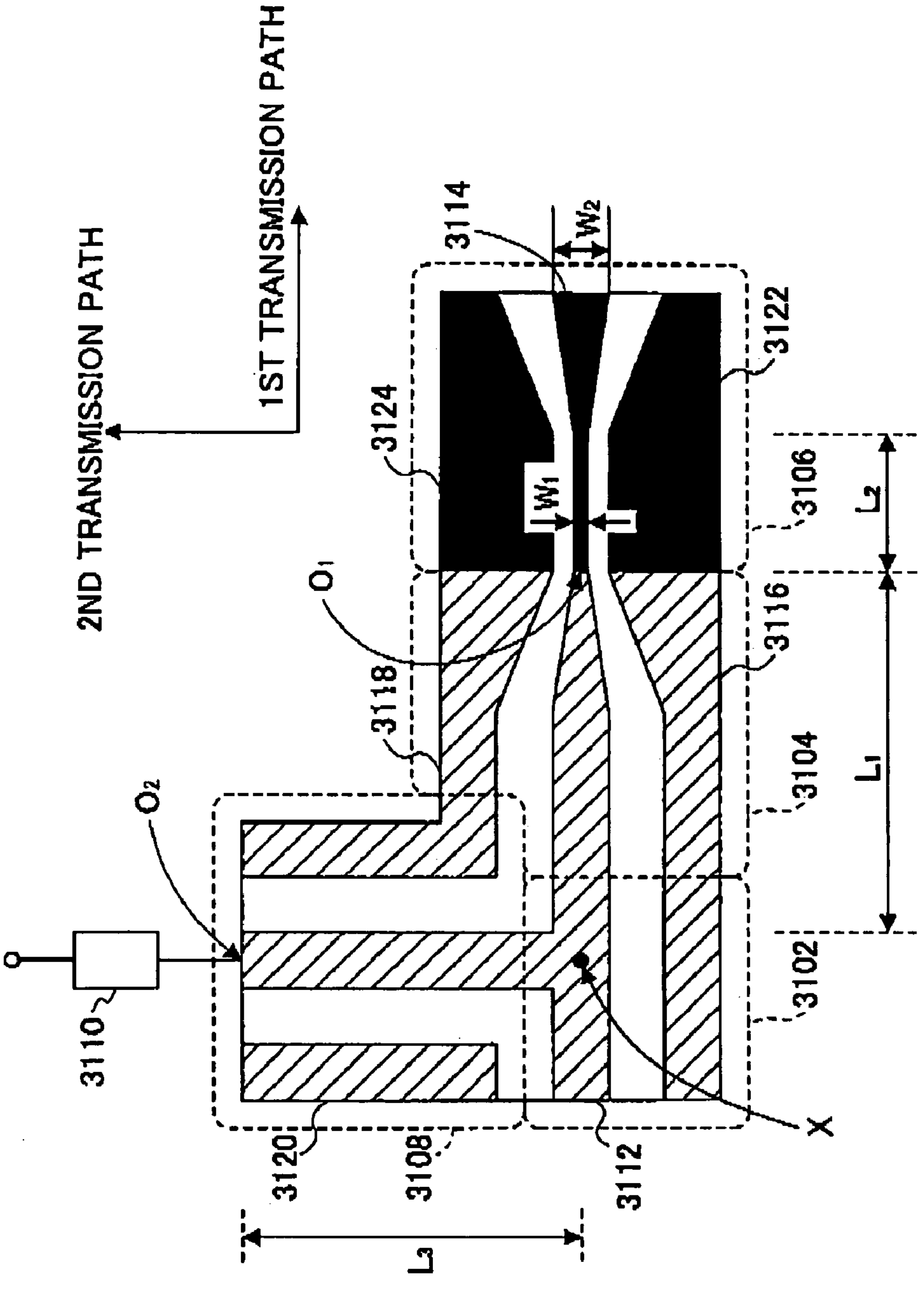
FIG. 1A is a plan view of a signal switching device as an example of a first embodiment of the present invention.
Figure 1B:
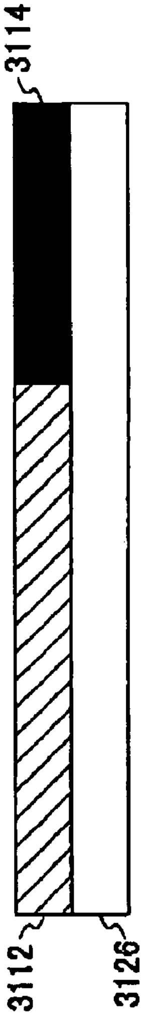
FIG. 1B is a cross-sectional side view of the signal switching device illustrated in FIG. 1A.

FIG. 1A is a plan view of a signal switching device 3100 as an example of a first embodiment of the present invention, and FIG. 1B is a cross-sectional side view of the signal switching device 3100 illustrated in FIG. 1A.

The signal switching device 3100 includes a switching section 3102 that switches high frequency input signals to a first transmission path or a second transmission path as described below, a first transmission section 3104 that is connected with the switching section 3102 and forms the first transmission path, a serial transmission section 3106 that is connected with the first transmission section 3104, a second transmission section 3108 that is connected with the switching section 3102 and forms the second transmission path, and a switch 3110 that is connected with the second transmission section 3108. These transmission sections are formed by a coplanar wave guide Strip conductors 3112 and 3114 are provided at centers of the first transmission section 3104 and the serial transmission section 3106, respectively, and grounding conductors 3116, 3118, 3120, 3122, and 3124 are provided on the two sides of and at distances from the strip conductors 3112 and 3114.

The serial transmission section 3106 is made from a superconducting material; the switching section 3102, the first transmission section 3104, and the second transmission section 3108 are made from normal conducting materials. As shown in FIG. 1B, the structure shown in FIG. 1A is formed on a dielectric material 3126.

The serial transmission section 3106, which is made from a superconducting material, has high electrical resistance at a temperature higher than a critical temperature (for example, 70K), and assumes a superconducting state with an extremely low electrical resistance when being cooled to a temperature lower than the critical temperature. The superconducting material used for the serial transmission section 3106 is selected by considering the critical temperature, the electrical resistivity in the non-superconducting state, and lengths of the sections mentioned above. Specifically, The superconducting material may comprise a metal, a metal oxide, or a ceramic, and may include Nb—Ti, $Nb_3Sn$, $V_3Ga$, YBCO (yttrium barium copper oxide), RE-BCO (RE-barium-copper-oxide), BSCCO (bismuth-strontium-calcium-copper-oxide), BPSCCO(bismuth-lead-strontium-calcium-copper-oxide), HBCCO (mercury-barium-calcium-copper-oxide), or TBCCO (thallium-barium-calcium-copper-oxide). Here, RE represents one of La (lanthanum), Nd (neodymium), Sm (samarium), Eu (europium), Gd (gadolinium), Dy (dysprosium), Er (erbium), Tm (thulium), Yb (ytterbium), or Lu (lutetium).

Although not illustrated in FIG. 1A, a circuit is connected to the output of the serial transmission section 3106 and is adjusted to match the serial transmission section 3106 when the serial transmission section 3106 is in the superconducting state; similarly, a circuit is connected to the switch 3110 that is adjusted to match the switch 3110 when the switch 3110 is set ON.

In order that the input impedance $Z_{XO1}$ from a branching point X of the first transmission path and the second transmission path to the first transmission path matches the characteristic impedance of the first transmission section 3104 when the serial transmission section 3106 is in the superconducting state, lengths and widths of the first transmission section 3104 and the second transmission section 3106, dielectric constant and thickness of the dielectric material 3126, and sizes of gaps between the first transmission section 3104 and the serial transmission section 3106 with the grounding conductors 3116, 3118, 3120, 3122, and 3124 are adjusted.

In a section of a length L2 at the input end of the serial transmission section 3106, the width of the strip conductor 3114 is w1, much less than the width w2 of the strip conductor 3114 at the output end, As described below, the purpose of making the input end of the strip conductor 3114 thinner is to increase the electrical resistance of the strip conductor 3114 when the serial transmission section 3106 is in the non-superconducting state. In the present example, the strip conductor 3114 has a shape of a taper with its width varying continuously from a small value w1 to a large value w2. The present invention is not limited to this, and any other shape may be used. For example, the strip conductor 3114 may have a stepwise shape But, when varying the width of the strip conductor 3114, it is necessary to maintain the characteristic impedance of the transmission path unchanged. When a coplanar wave guide is used, it is necessary to adjust the width of the strip conductor 3114 and the sizes of the gaps appropriately. That is, each gap is adjusted to be wide or narrow in connection with the width of the strip conductor 3114 to keep the characteristic impedance of the first transmission path constant. Therefore, as illustrated in FIG. 1, the gap in the region including the thinner portion of the strip conductor 3114 is narrower than that of the thicker portion of the strip conductor 3114.

The lengths L1, L2, and L3 of the transmission paths may be adjusted to the most appropriate values, for example, in the range from 0.1 to a few millimeters. The widths of the transmission paths may also take various values, for example, w1 may be set to 3 μm, and w2 may be set to 10 μm.

The operation of the switching device 3100 is explained below First, it is shown how to switch high frequency signals input to the switching section 3102 to the second transmission path. In this case, the switch 3110 is set ON, and the serial transmission section 3106 is set to the non-superconducting state. When the switch 3110 is ON, the second transmission section 3108, which forms the second transmission path, matches with the switch 3110 and the circuits connected thereto.

While, in the first transmission path, the first transmission section 3104 does not match with the serial transmission section 3106 that is in the non-superconducting state. If the input impedance $Z_{XO1}$ from the branching point X of the first transmission path and the second transmission path to the first transmission path is very large (ideally, infinite), the input signals propagate to the second transmission path with low signal loss. In the present example, transmission path length L1 is adjusted so that the input impedance $Z_{XO1}$ is greater than a sufficiently large value.

Figure 2:
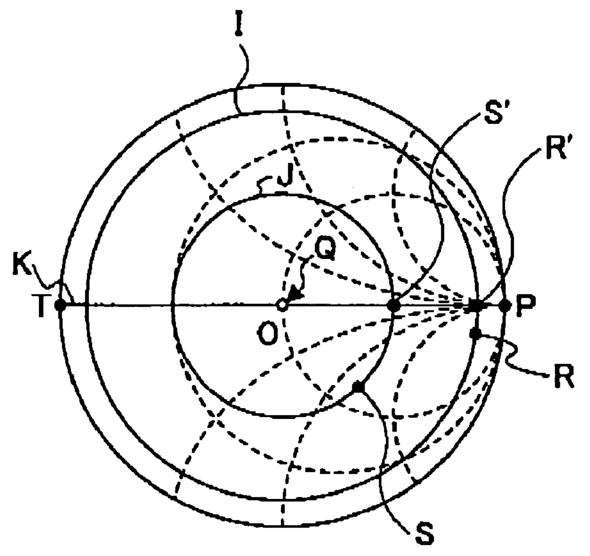
FIG. 2 shows a Smith chart presenting variation of input impedance.

Next, it is described how to adjust the transmission path length L1 with reference to the Smith Chart in FIG. 2.

FIG. 2 shows a Smith chart presenting variation of input impedance.

The origin O of the Smith chart in FIG. 2 corresponds to the characteristic impedance of the first transmission path. First, when the serial transmission section 3106 is in the superconducting state, as described above, the first transmission section 3104 and the serial transmission section 3106 match with each other, and the input impedance $Z_{XO1}$ of the first transmission path equals the characteristic impedance. Hence, in the Smith chart, the input impedance $Z_{XO1}$ is at the origin O or a point Q near the origin O, and the input impedance $Z_{O1}$ of the serial transmission section 3106 is as well. Then, when the serial transmission section 3106 is switched to the non-superconducting state, because the input-impedance of the serial transmission section 3106 differs from the characteristic impedance, the first transmission section 3104 and the serial transmission section 3106 (as well as the subsequent circuits) do not match with each other. In this case, the input impedance is, for example, at a point R at a distance from the origin O.

Hence, when the length L1 of the first transmission section 3104 is changed, the point R moves along a circle I in the Smith chart. If the length L1 of the first transmission section is varied from zero to ½ wavelength of the input signal, the corresponding locus in the Smith chart forms the circle 1. Then even though the length L1 increases further, the corresponding point in the Smith chart just moves along the circle I. In the Smith chart, the point P at the rightmost end of the horizontal straight line K through the origin O represents an infinite impedance, and the point T at the leftmost end of the straight line K represents an impedance of zero. Consequently, in order to increase the input impedance $Z_{XO1}$ it is sufficient to adjust the length L1 to move the point representing the impedance $Z_{XO1}$ to the cross-point R' of the circle I and the straight line K. Due to this, the impedance $Z_{XO1}$ may approach the point P (infinity) as close as possible.

In the present example, the section of the serial transmission section 3106 having a length L2 is formed to have a path width w1 at the input end much less than the path width w2 at the output end. Therefore, under the non-superconducting condition, the serial transmission section 3106 has a very large resistance compared with a transmission path having a large and constant width. Although the impedance $Z_{O1}$ of the serial transmission section 106 is very small under the superconducting condition, it becomes very large under the non-superconducting condition Hence, when switching the serial transmission section 3106 from the non-superconducting condition to the superconducting condition, or vice versa, the impedance $Z_{O1}$ changes greatly compared with a transmission path having a large and constant width (for example, the transmission path width in the whole serial transmission section 3106 being w2). Accordingly, in the Smith chart, the impedances of the two states correspond to two circles relative to the origin O, one of them having a very small radius (substantially zero), and the other having a very large radius, for example, the circle I in FIG. 2. With a large circle, it is possible to adjust the input impedance $Z_{XO1}$ or $Z_{O1}$ to be much closer to the impedance corresponding to the point P (infinity).

If the serial transmission section 3106 has a large and constant width w2 from the input end to the output end, even though the resistance of the transmission path is large under the non-superconducting state, it cannot be vary greatly because there is not a thin portion. As a result, between the non-superconducting condition and the superconducting condition, the magnitude of the change of the impedance $Z_{01}$ is small, and under the non-superconducting condition, for example, the impedance $Z_{O1}$ is at point S on a circle J having a relatively small radius. Even in this case, in order to increase the input impedance as much as possible, one may adjust the transmission path length to move the point representing the impedance to the cross-point S' of the circle J and the straight line K.

In the Smith chart, the radius of a circle (the distance from the origin) corresponds to the reflectivity. The input impedance under the matching condition (characteristic impedance) is at the origin O. This implies that the reflectivity of the first transmission path is zero, and signals propagate without reflection at all. To the contrary, if the reflectivity is 1, the signals are totally reflected and do not propagate in the first transmission section 3104 at all. When the reflectivity decreases, the amount of the signals propagating to the first transmission path increases accordingly, that is, the amount of the signals propagating to the second transmission path decreases. Therefore, it is necessary to increase the reflectivity in order to prevent propagation of the input signals to the first transmission path when the serial transmission section 3106 is in the non-superconducting state. In the present example, by making a portion of the serial transmission section 3106 thin, the input impedance $Z_{O1}$ changes greatly. As a result, the input impedance of the first transmission path may be increased (close to point P), and additionally, a large reflectivity can be obtained.

Next, it is shown how to switch signals input to the switching section 3102 to the first transmission path. In this case, the switch 3110 is set OFF and the serial transmission section 3106 is set to the superconducting state. As described above, the first transmission section 3104 and the superconducting serial transmission section 3106 match with each other, and the signals from the switching section 3102 to the first transmission path can be well transmitted to the later-stage circuits. On the other hand, the second transmission section 3108 and the switch 3110 do not match with each other. In this case, the length L3 of the second transmission section 3108 is adjusted so that the input impedance $Z_{XO2}$ viewed from the branching point X of the first transmission path and the second transmission path to the connection node $O_2$ becomes very large (substantially infinite). If the impedance is sufficiently large when the switch 3110 is OFF, the distance from the branching point X of the first transmission path and the second transmission path to the switch 3100 can be set to be substantially zero. Because the input impedance $Z_{XO2}$ of the second transmission path is much greater than that of the first transmission path, signals essentially do not propagate to the second transmission path, but to the first transmission path with low signal loss. Consequently, a switching device with low signal loss and good isolation quality is obtainable.

Figure 3:
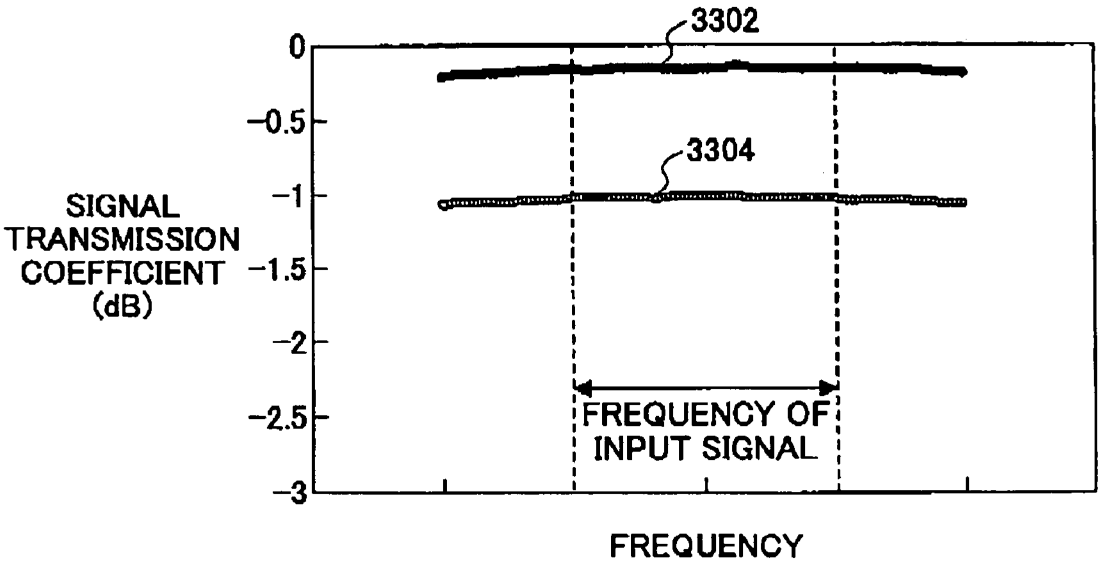
FIG. 3 shows graphs presenting simulation results of signal transmission coefficients (signal loss)

FIG. 3 shows graphs presenting simulation results of signal transmission coefficients (signal loss) when the input signals are transmitted to the second transmission path. In FIG. 3, the abscissa represents the frequency of the input signals having frequencies in a specific region, and the ordinate represents the transmission coefficient of the second transmission path. In the ordinate scale, "0 dB" indicates that there is no signal loss, and "−3 dB" indicates that about ½ of the input signal is lost. In FIG. 3, the graph 3302 on the upper side corresponds to the signal switching device 3100 according to the present embodiment including a thin portion at the input end of the serial transmission section 3106. As shown by the graph 3302, there is almost no signal loss even though the frequency changes in a rather wide range. Meanwhile, the graph 3304 on the lower side corresponds to a signal switching device without the long and thin portion at the input end of the serial transmission section, for example, it has a constant width. As shown by the graph 3304, there is a higher signal loss than in graph 3302.

Second Example

Figure 4A:
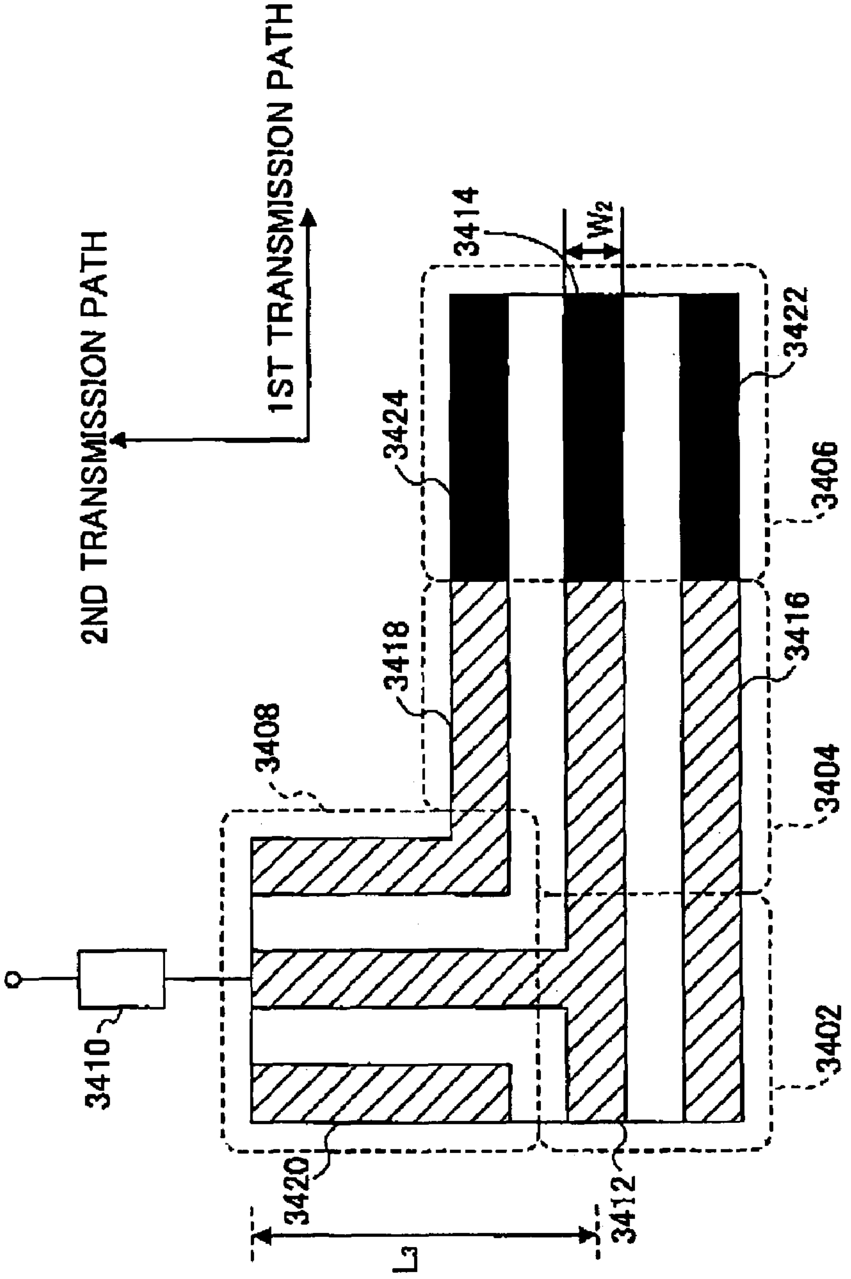
FIG. 4A is a plan view of a signal switching device as a second example of the first embodiment of the present invention.
Figure 4B:
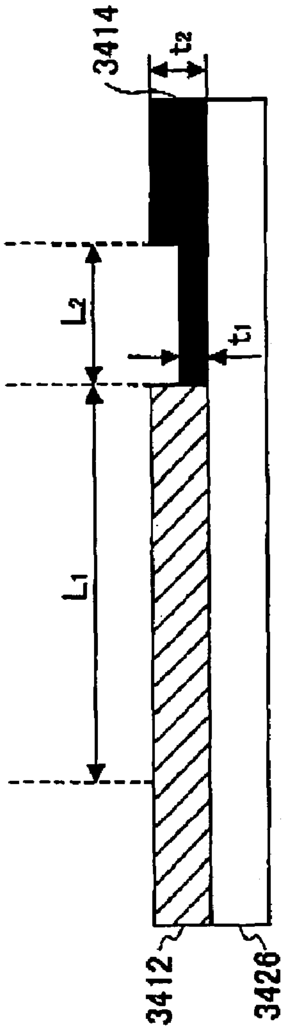
FIG. 4B is a cross-sectional side view of the signal switching device shown in FIG. 4A.

FIG. 4A is a plan view of a signal switching device 3400 as a second example of the first embodiment of the present invention, and FIG. 4B is a cross-sectional side view of the signal switching device 3400 shown in FIG. 4A.

Similar to the signal switching device 3100 described above, the signal switching device 3400 includes a switching section 3402 that switches high frequency input signals to a first transmission path or a second transmission path, a first transmission section 3404 that is connected with the switching section 3402 and forms the first transmission path, a serial transmission section 3406 that is connected with the first transmission section 3404, a second transmission section 3408 that is connected with the switching section 3402 and forms the second transmission path, and a switch 3410 that is connected with the second transmission section 3408. These transmission sections are formed by a coplanar wave guide. Strip conductors 3412 and 3414 are provided at centers of the first transmission section 3404 and the serial transmission section 3406, respectively, and grounding conductors 3416, 3418, 3420, 3422, and 3424 are provided on the two sides of and at distances from the strip conductors 3412 and 3414.

The serial transmission section 3406 is made from a superconducting material; the switching section 3402, the first transmission section 3404, and the second transmission section 3408 are made from normal conducting materials. As shown in FIG. 4B, the structure shown in FIG. 4A is formed on a dielectric material 3426. The same superconducting materials as described in the first embodiment may be used for the serial transmission section 3406.

In the present example, as illustrated in FIG. 4A, the strip conductor 3414 in the serial transmission section 3406 is formed in such a way that the width at the input end is the same as that at the output end (indicated by w2), whereas the thickness t1 of the strip conductor 3414 in a section of a length L2 at the input end of the serial transmission section 3406 is less than that at the output end (t2).

When the serial transmission section 3406 is in the superconducting state, the thickness t1, dielectric constant and thickness of the dielectric material 3426, and sizes of gaps between the first transmission section 3404 and the serial transmission section 3406 with the grounding conductors are adjusted so that the characteristic impedance of the first transmission section 3404 matches that of the serial transmission section 3406.

In the present example, by providing a thin section in the serial transmission section 3406, the electrical resistance of the serial transmission section 3406 under the non-superconducting condition is large compared with the case in which the strip conductor 3414 has a large and constant thickness.

As described before, in order to yield a large change of the input impedance $Z_{QX1}$ when switching the serial transmission section 3406 from the non-superconducting condition to the superconducting condition, or vice versa, the section of a length L2 of the strip conductor 3414 may be formed to have a smaller width but with a constant thickness, as illustrated in FIG. 1A. Alternatively, as illustrated in FIG. 4A, the section of a length L2 of the strip conductor 3414 may be formed to have a less thickness but with a constant width.

Furthermore, the structures in FIG. 1A and FIG. 4A may be combined as described below.

Figure 5A:
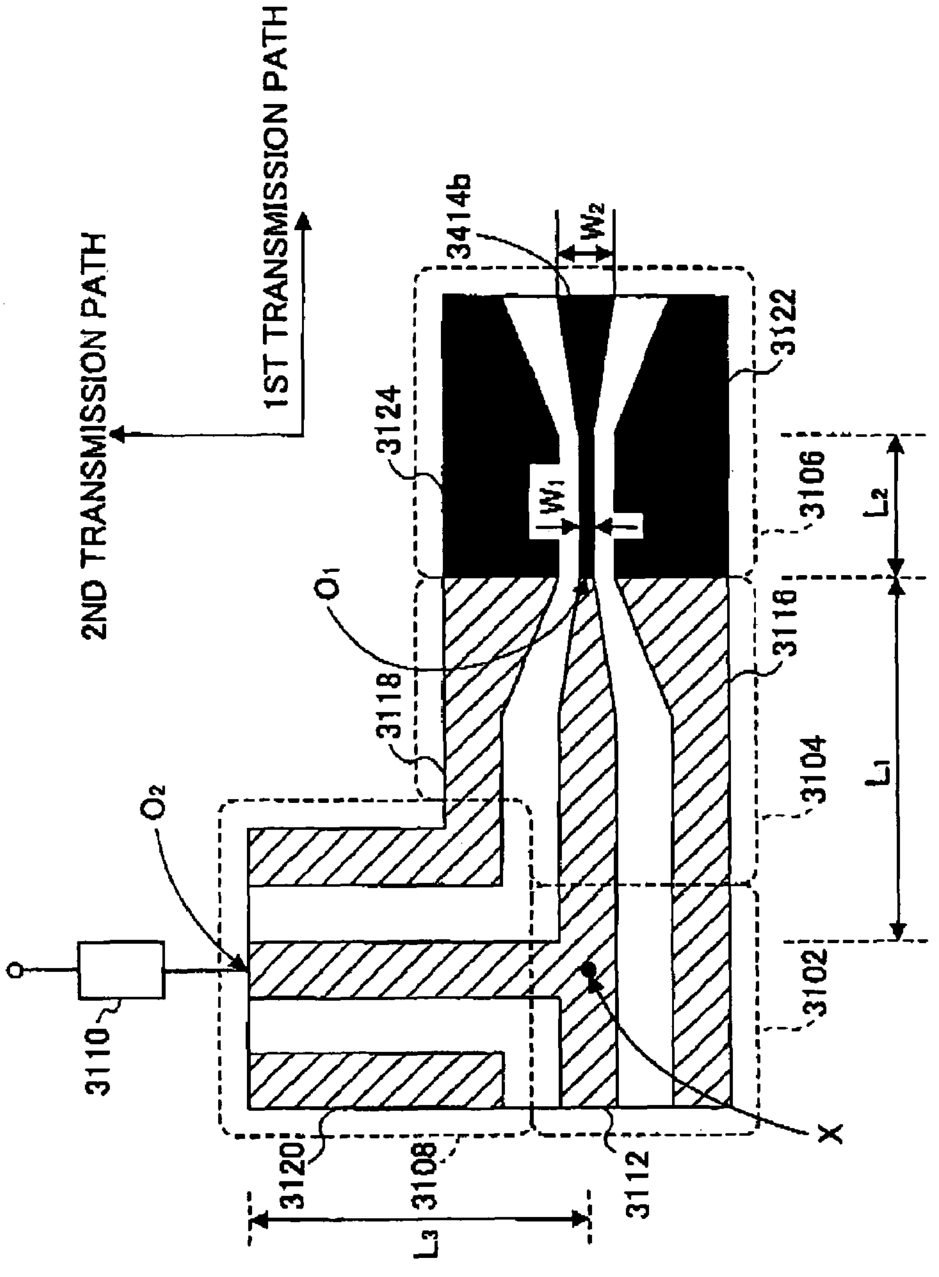
FIG. 5A and FIG. 5B are a plan view and a cross-sectional side view of a signal switching device as a modification to the signal switching device shown in FIG. 4A and FIG. 4B.
Figure 5B:
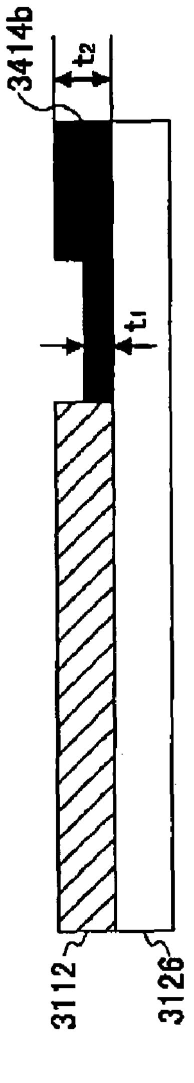

FIG. 5A and FIG. 5B are a plan view and a cross-sectional side view of a signal switching device 3400*b* as a modification to the signal switching device 3400 shown in FIG. 4A and FIG. 4B. In FIG. 5A and FIG. 5B, the same numbers are assigned to the same elements as in FIG. 1A, FIG. 1B, FIG. 4A, and FIG. 4B.

As shown in FIG. 5A and FIG. 5B, the strip conductor 3414*b* is obtained by combining the structures in FIG. 1A and FIG. 4A, and the section of the length of L2 has both a small width and a small thickness. D tailed explanation is omitted.

With the signal switching device 3400*b*, it is possible to further increase the electrical resistance of the serial transmission section under the non-superconducting condition.

In either case, a section of a specified length of the serial transmission section has a smaller cross section than the output end of the transmission path, and thereby, the electrical resistance of the transmission section under the non-superconducting condition can be made large.

In the related art, when connecting a circuit having a different path width to, for example, the serial transmission section 3406, usually, a connector has to be used between them to maintain a good connection condition so as to reduce signal loss at the point of path width discontinuity. According to the present embodiments, by making the path width of the transmission section constant, such a connector is not necessary; size of the device can be reduced by the size of the connector, and this in turn lowers the cost of the device.

In FIG. 4A and FIG. 4B path lengths L1, L2, and L3 are adjusted in the same way as in the preceding example; the operation of the switching device 3400 is the same as that of the switching device 3100 in the first embodiment.

Third Example

Figure 6A:
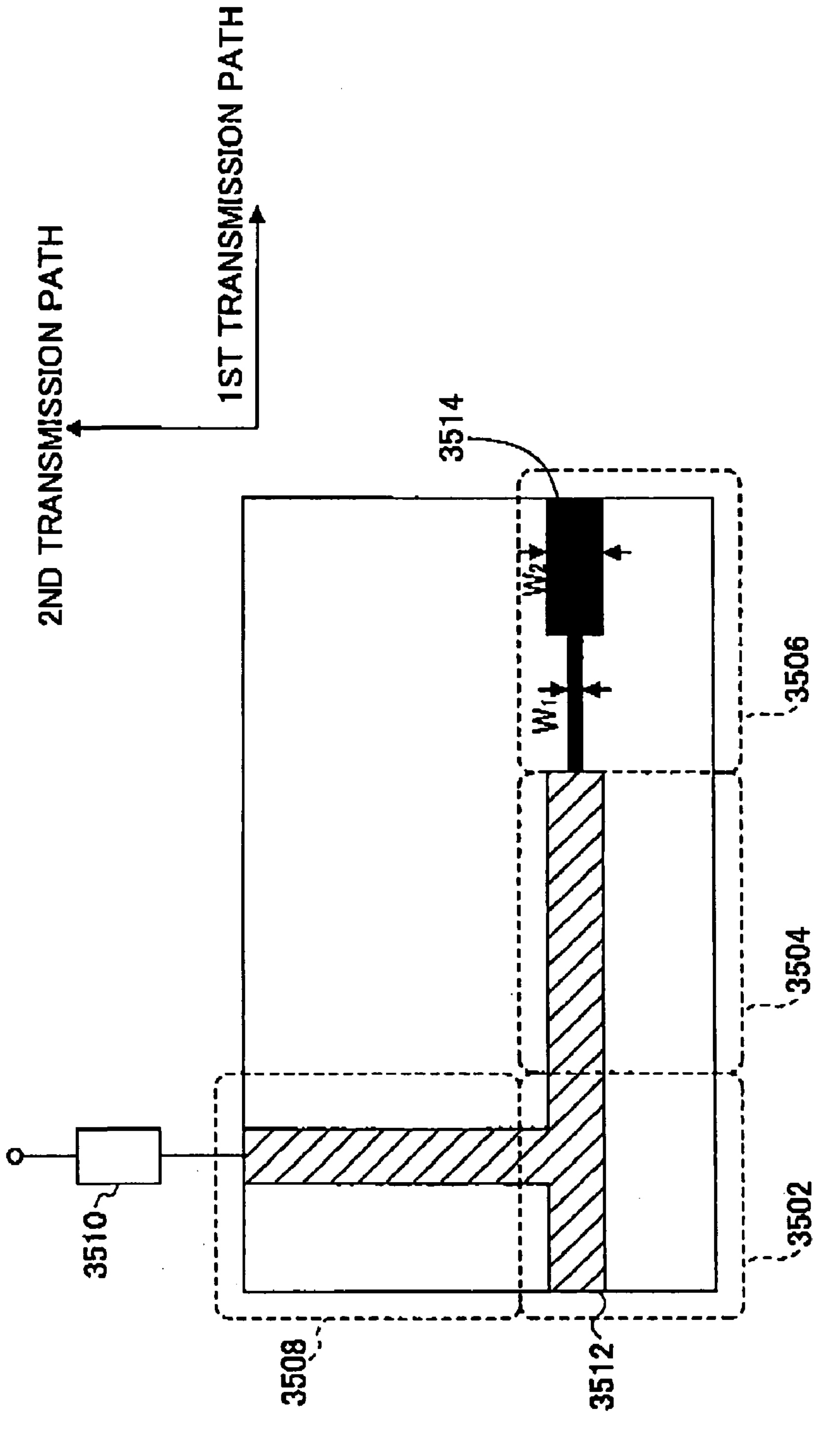
FIG. 6A is a plan view of a signal switching device as a third example of the first embodiment of the present invention.
Figure 6B:
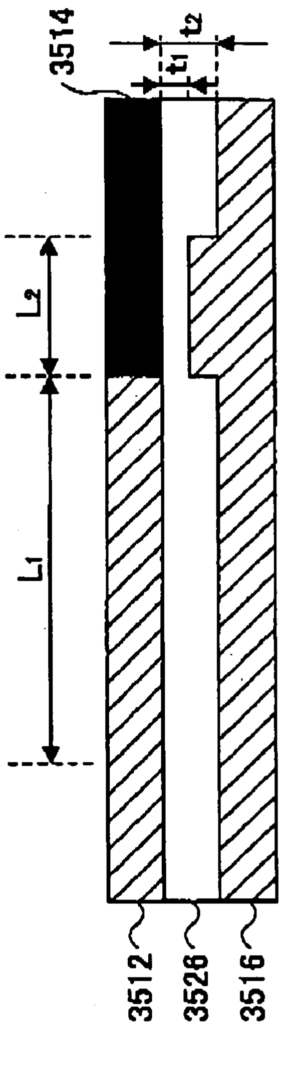
FIG. 6B is a cross-sectional side view of the signal switching device shown in FIG. 6A.

FIG. 6A is a plan view of a signal switching device 3500 as a third example of the first embodiment of the present invention, and FIG. 6B is a cross-sectional side view of the signal switching device 3500 shown in FIG. 6A.

The signal switching device 3500 includes a switching section 3502 that switches high frequency input signals to a first transmission path or a second transmission path, a first transmission section 3504 that is connected with the switching section 3502 and forms the first transmission path, a serial transmission section 3506 that is connected with the first transmission section 3504, a second transmission section 3508 that is connected with the switching section 3502 and forms the second transmission path, and a switch 3510 that is connected with the second transmission section 3508. These transmission sections are formed by a micro-strip line. The serial transmission section 3506 is made from a superconducting material; the switching section 3502, the first transmission section 3504, and the second transmission section 3508 are made from normal conducting materials. As shown in FIG. 6B, the structure shown in FIG. 6A is formed on a dielectric material 3526 and the dielectric material 3526 is on a grounding conductor 3516. The same superconducting materials as described in the first embodiment may be used for the serial transmission section 3506.

In the present example, the strip conductor 3514 in the serial transmission section 3506 is formed in such a way that the path width w1 in a section of a length L2 at the input end is less than the path width w2 at the output end, whereas the thickness of the section of a width w1 is the same as that at the output end.

The characteristic impedance of a micro-strip line depends on the width of the transmission path, thickness of the dielectric material 3526 (that is, distance from the strip conductor 3512 to the grounding conductor 3516), and the dielectric constant of the dielectric material 3526. In order to maintain a constant characteristic impedance in the transmission path through the serial transmission section 3506 even when its width changes, the thickness t1 of the dielectric layer 3526 in the section of the width w1 is formed to be less than the thickness t2 at the output end of the dielectric layer 3526.

Figure 7:
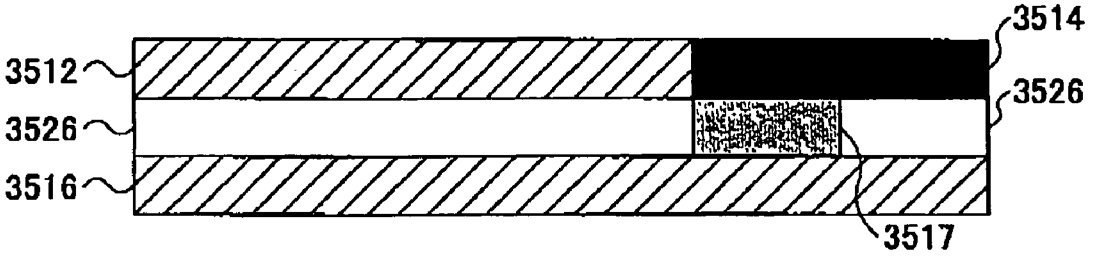
FIG. 7 is a cross-sectional side view of a modification to the signal switching device shown in FIG. 6A.

FIG. 7 is a cross-sectional side view of a modification to the signal switching device 3500 shown in FIG. 6A.

As illustrated in FIG. 7, in the section of a length L2, where the thickness of the dielectric material 3526 ought to be changed, a dielectric material 3517 having a different dielectric constant from the dielectric material 3526 may be used. In doing so, the distance from the strip conductor 3514 to the grounding conductor 3516 can be maintained to be constant (t2) in the entire region.

When the serial transmission section 3506 is in the superconducting state, width of the transmission path, dielectric constant and thickness of the dielectric material 3526 are adjusted so that the characteristic impedance of the first transmission section 3504 matches the characteristic impedance of the serial transmission section 3506.

In the present example, because a thin section is provided in the serial transmission section 3506, under the non-superconducting condition, the serial transmission section 3506 has a very large resistance compared with a transmission path having a large and constant width.

The same as the case involving a coplanar wave guide, in order to yield a large change of the input impedance $Z_{OX1}$ when switching the serial transmission section 3506 from the non-superconducting condition to the superconducting condition, or vice versa, the section of a length L2 of the strip conductor 3514 may be formed to have a smaller width but with a constant thickness, as illustrated in FIG. 5A. Alternatively, the section of a length L2 of the strip conductor 3514 may also be formed to have a smaller thickness but with a constant width.

Furthermore, the above two structures may be combined as described below.

Figure 8A:
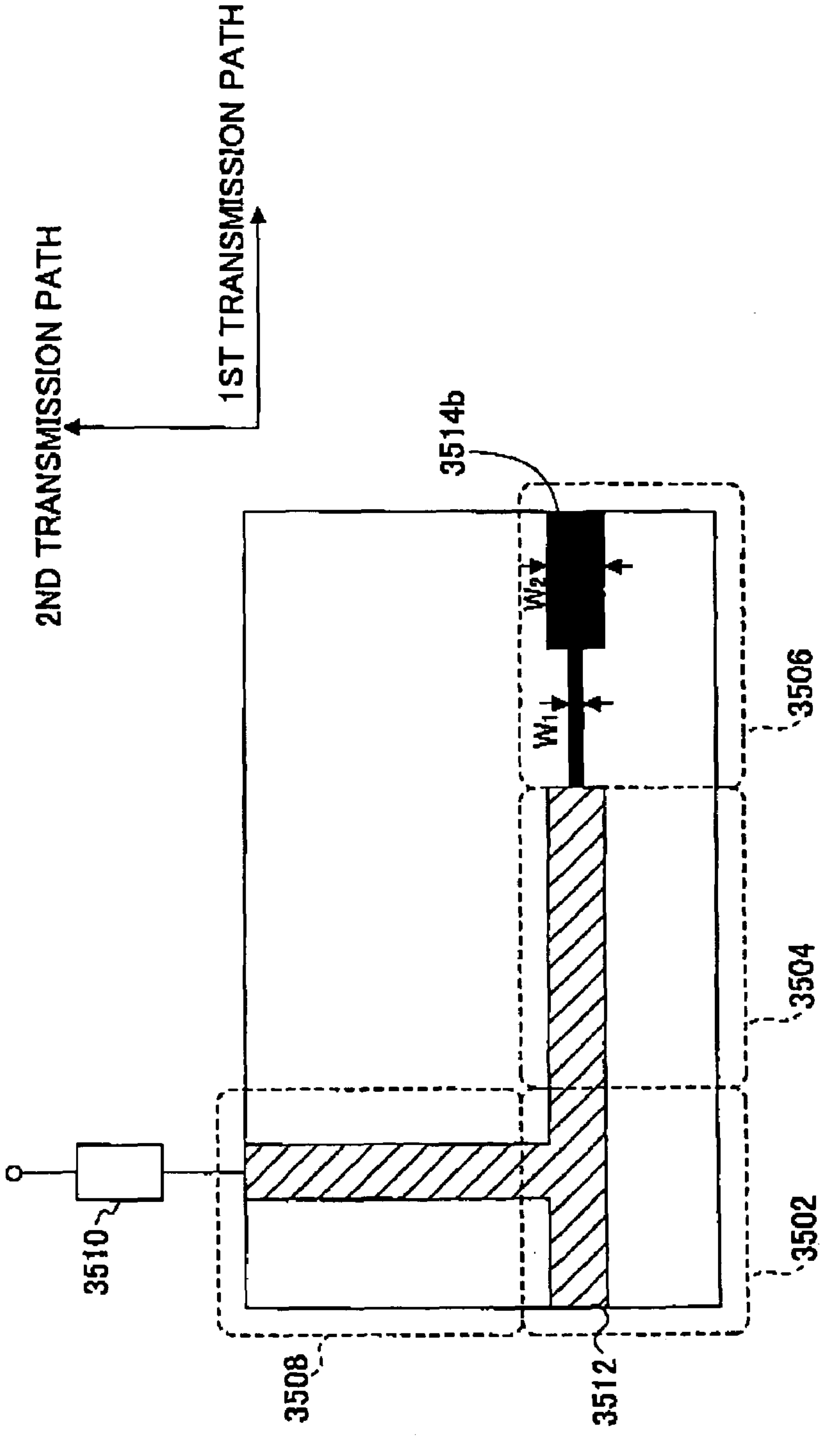
FIG. 8A and FIG. 8B are a plan view and a cross-sectional side view of a signal switching device as a modification to the signal switching device shown in FIG. 6A and FIG. 6B.
Figure 8B:
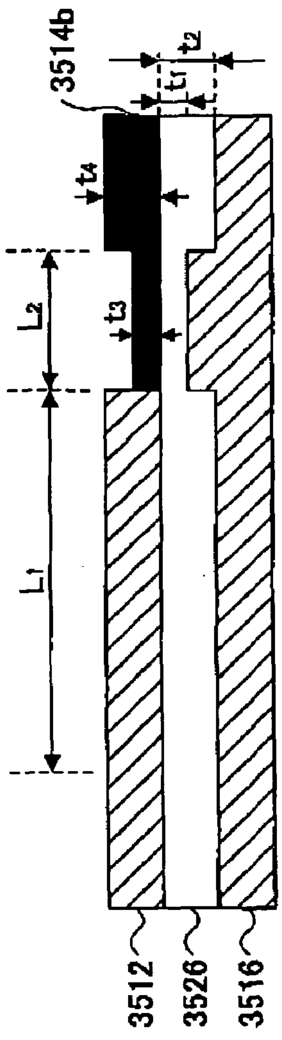

FIG. 8A and FIG. 8B are a plan view and a cross-sectional side view of a signal switching device 3500*b* as a modification to the signal switching device 3500 shown in FIG. 6A and FIG. 6B. In FIG. 8A and FIG. 8B, the same numbers are assigned to the same elements as FIG. 6A and FIG. 6B.

As shown in FIG. 8A and FIG. 8B, the section of the length of L2 of the strip conductor 3514*b* has both a small width and a small thickness. Detailed explanation is omitted.

With the signal switching device 3500*b*, it is possible to further increase the electrical resistance of the serial transmission section under the non-superconducting condition.

Path lengths L1, L2, and L3 are adjusted in the same way as described above.

Fourth Example

Figure 9:
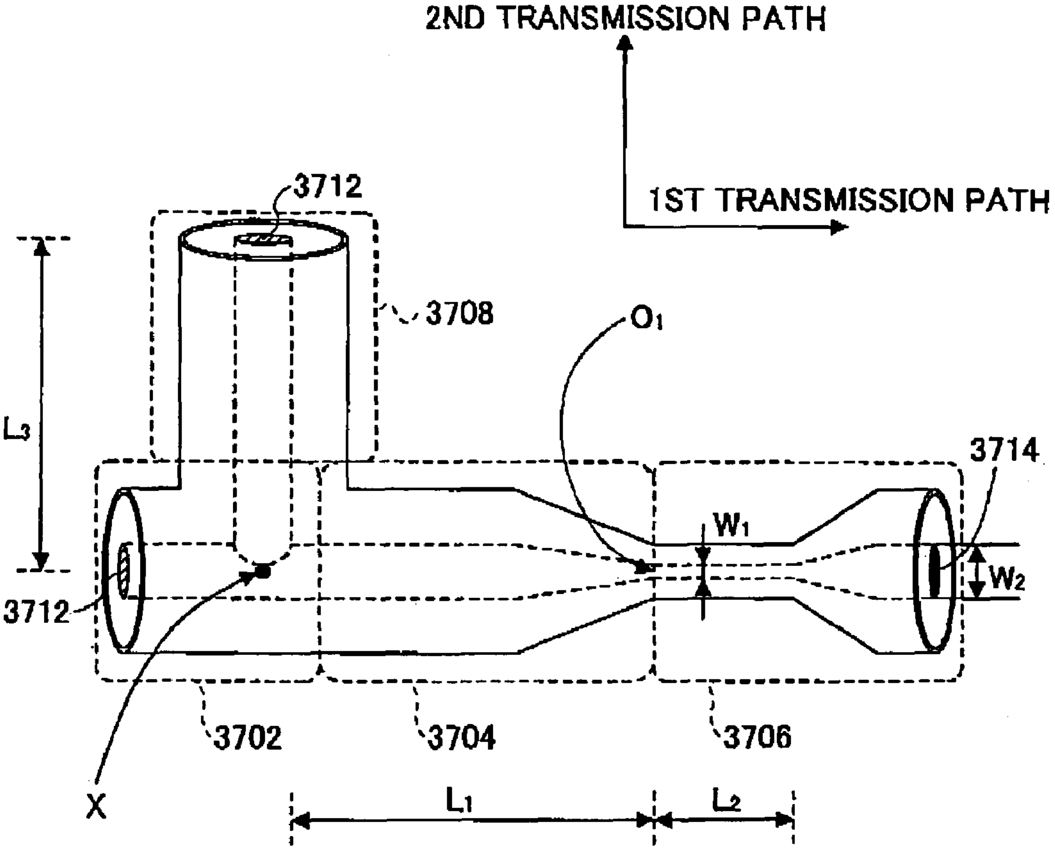
FIG. 9 is a plan view of a signal switching device as a fourth example of the first embodiment of the present invention.

FIG. 9 is a plan view of a signal switching device 3700 as a fourth example of the first embodiment of the present invention. Different from the previous examples, the signal switching device 3700 forms a co-axial line.

The signal switching device 3700 includes a switching section 3702 that switches high frequency input signals to a first transmission path or a second transmission path, a first transmission section 3704 that is connected with the switching section 3702 and forms the first transmission path, a serial transmission section 3706 that is connected with the first transmission section 3704, and a second transmission section 3708 that is connected with the switching section 3702 and forms the second transmission path. The conductor 3714 at the center of the serial transmission section 3706 is made from a superconducting material, and the switching section 3702 and a conductor 3712 at the center of the first transmission section 3704 are made from normal conducting materials.

In the present example, the conductor 3714 in the serial transmission section 3706 is formed in such a way that the diameter w1 of a section of a length L2 at the input end is less than that at the output end (w2), and the diameter of the cable including the conductor 3714 in the section of a length L2 is also less than that of the cable at the output end.

The characteristic impedance of a co-axial cable depends on the diameter of the conducting material, thickness of the dielectric material (that is, distance from the central conductor to the grounding conductor), and the dielectric constant of the dielectric material. Therefore, in order to maintain a constant characteristic impedance for the transmission path through the serial transmission section 3706 even when the diameter of the conductor 3714 changes, the thickness t1 of the dielectric material in the section of a smaller diameter w1 is formed to be less than that of the dielectric material at the output end.

When the serial transmission section 3706 is in the superconducting state, the diameter of the conductor 3714, the dielectric constant and diameter of the dielectric material are adjusted so that the characteristic impedance of the first transmission section 3704 matches the characteristic impedance of the serial transmission section 3706.

In the present example, because a thin section is provided in the serial transmission section 3706, under the non-superconducting condition, the serial transmission section

3706 has a very large resistance compared with a transmission path having a large and constant thickness.

Similar to the co-planar wave guide and the micro-strip line, in order to yield a large change of the input impedance $Z_{OX1}$ when switching from the non-superconducting condition to the superconducting condition, or vice versa, it is preferable that the section of the length L2 of the conductor 3714 be formed to have a smaller cross section.

Path lengths L1, L2, and L3 are adjusted in the same way as in the previous embodiments.

Fifth Example

In the above examples, the signal switching devices are configured to have two transmission paths. It is certain that more than two transmission paths may be provided in a signal switching device.

Figure 10A:
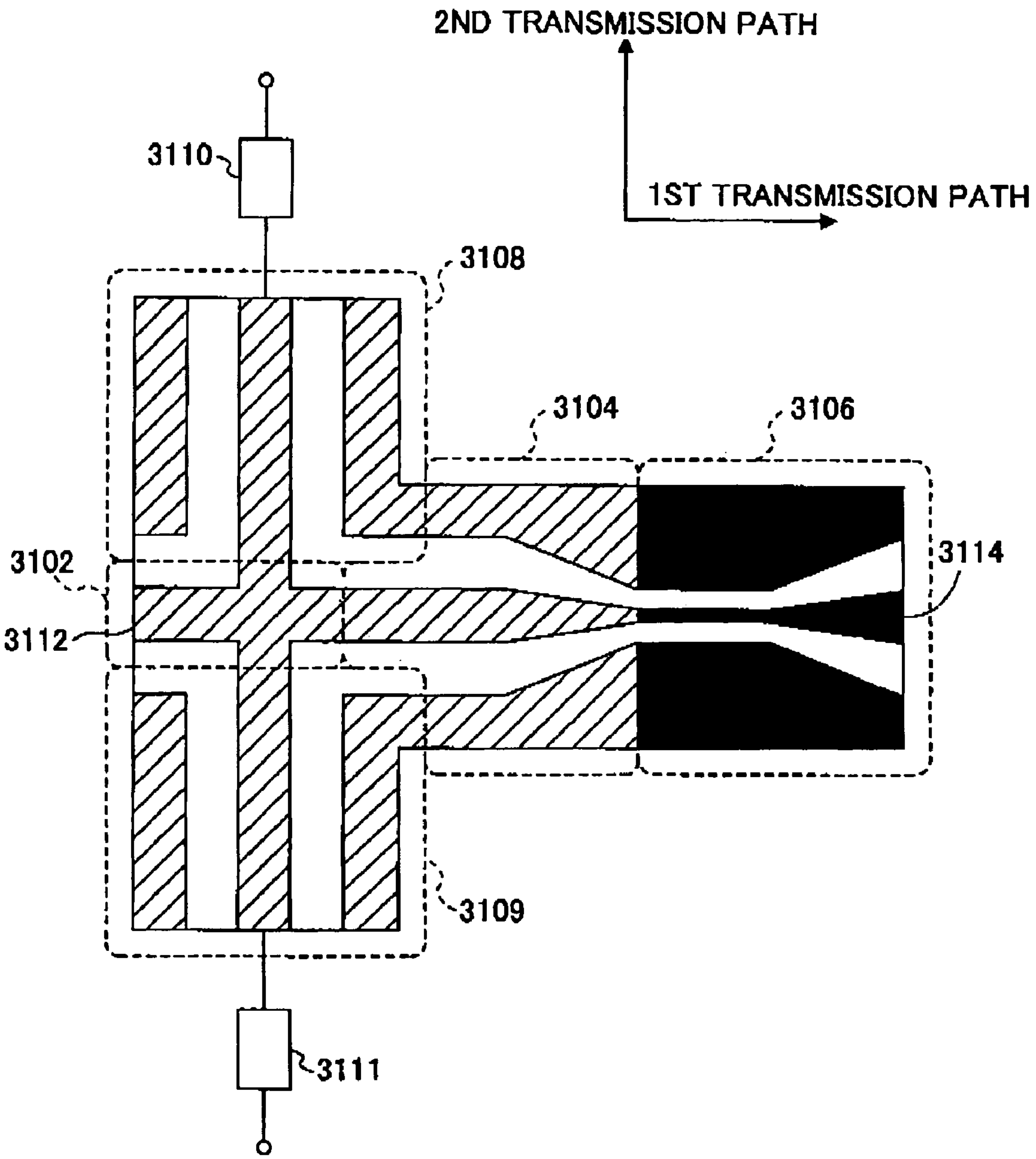
FIG. 10A is a plan view of a signal switching device as a fifth example of the first embodiment of the present invention.
Figure 10B:
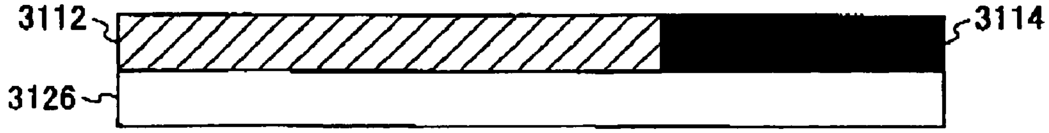
FIG. 10B is a cross-sectional side view of the signal switching device in FIG. 10A.

FIG. 10A is a plan view of a signal switching device 3800 as a fifth example of the first embodiment of the present invention, and FIG. 10B is a cross-sectional side view of the signal switching device 3800 in FIG. 10A In FIG. 10A and FIG. 10B, the same numbers are assigned to the same elements as in FIG. 1A and FIG. 1B.

As shown in FIG. 10, there are three transmission paths in the signal switching device 3800.

The signal switching device 3800 includes a switching section 3102 that switches high frequency input signals to a first transmission path, a second transmission path, or a third transmission path, a first transmission section 3104 that is connected with the switching section.3102 and forms the first transmission path, a serial transmission section 3106 that is connected with the first transmission section 3104, a second transmission section 3108 that is connected with the switching section 3102 and forms the second transmission path, a switch 3110 that is connected with the second transmission section 3108, a third transmission section 3109 that is connected with the switching section 3102 and forms the third transmission path, and a switch 3111 that is connected with the third transmission section 3109. The serial transmission section 3106 is made from a superconducting material; the switching section 3102, the first transmission section 3104, the second transmission section 3108, and the third transmission section 3109 are made from normal conducting materials. As shown in FIG. 10B, the structure shown in FIG. 10A is formed on a dielectric material 3126.

In the examples depicted in the present embodiment, the serial transmission section that is connected with the first transmission section is made from a superconducting material, and the state of the superconducting material is switched between the superconducting state and the non-superconducting state to select or not to select the first transmission path as the output channel. Each of the signal switching devices described in the present embodiment also includes a unit for changing the conducting states of the superconducting materials. For example, the unit changes the conducting state of the superconducting material by directly heating or cooling the superconducting material, or by conducting a direct current into the superconducting material and adjusting the magnitude of the current, or by applying a magnetic field to the superconducting material and adjusting the magnetic field.

The switch connected to the second transmission path may be configured to be set ON or OFF in response to the conducting state of the serial transmission section in the first transmission path. For example, a temperature sensor may be used to detect the change of the temperature of the serial transmission section to control the switch. In addition, the switch may be a semiconductor switch made up of PIN diodes or transistors, or a mechanical RF switch employing a mechanical ON/OFF mechanism, such as MEMS (Micro Electra Mechanical System). The former is capable of high speed switching, while the latter one has good insulation performance in the OFF state.

According to the present embodiment, when switching the input signals to the second transmission path, the transmission section of the first transmission path formed by a superconducting material is set to the non-superconducting state. Since a specified portion of the superconducting section in the first transmission path has a small cross section, the resistance of the first transmission path becomes very large Consequently, a good isolation characteristic can be achieved, furthermore, signal loss occurring in the first transmission path can be reduced effectively when outputting the signal through the second transmission path.

The shape of the cross section of the specified portion of the superconducting section may be appropriately adjusted by considering the width, thickness, and diameter of the transmission path. The configuration of the signal switching device, for example, a co-planar wave guide type, a micro-strip line type, or a co-axial line type, may be determined by considering the circuits or connectors connected to the signal switching device. From the point of view of yielding a large change of the input impedance when switching between the superconducting state and the non-superconducting state, it is preferable to set the path width, thickness or diameter as small as possible to make the cross section of the path smaller than that at the output end. Nevertheless, the path width, thickness or diameter should be sufficiently large to secure good electrical tolerance for propagating signals.

Second Embodiment

Figure 11:
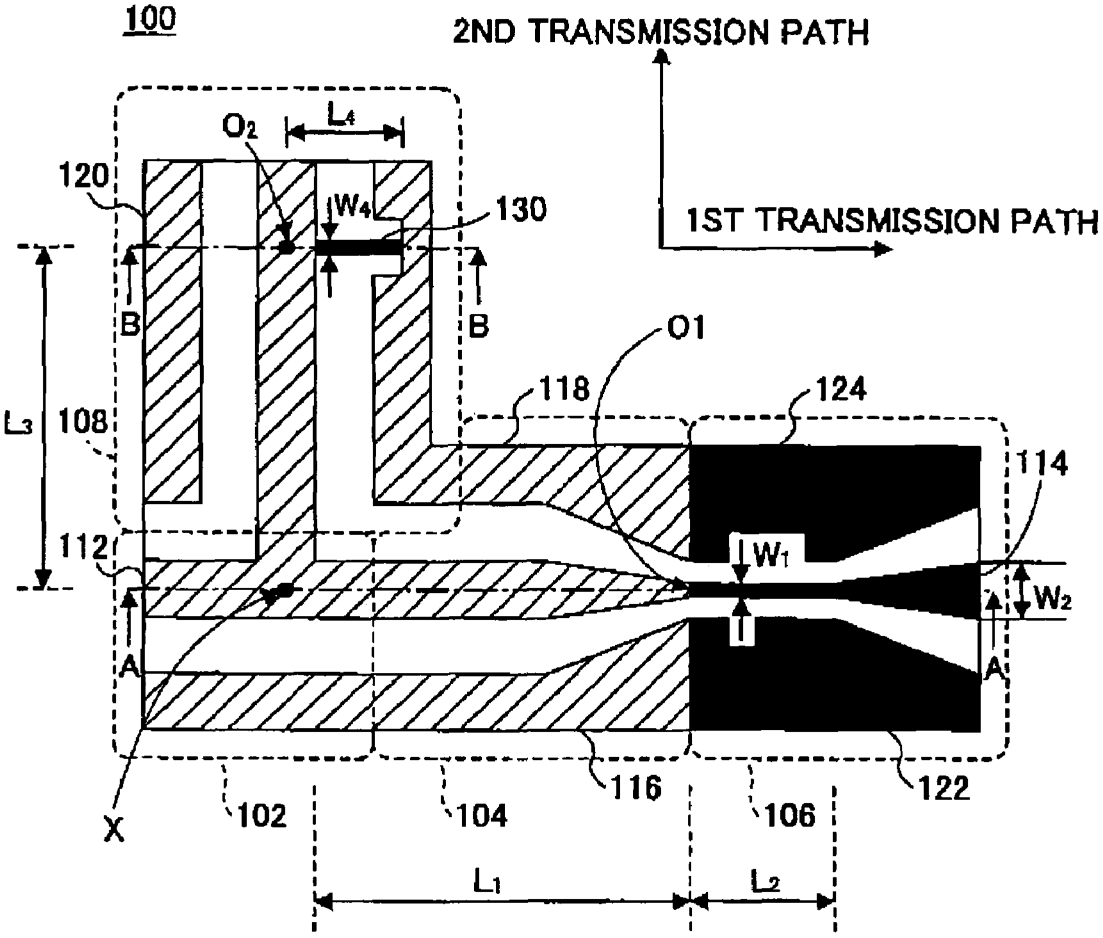
FIG. 11 is a plan view of a signal switching device according to a second embodiment of the present invention.
Figure 12:
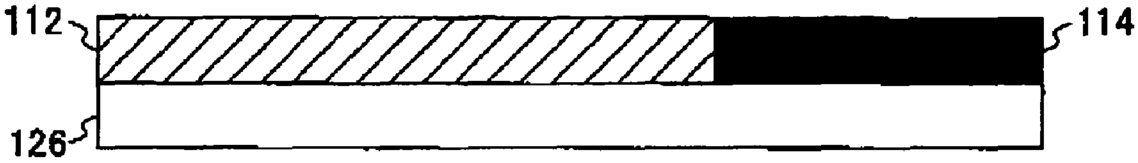
FIG. 12 is a cross-sectional side view of the signal switching device along the line AA in FIG, 11.
Figure 13:
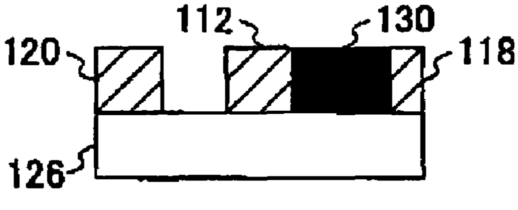
FIG. 13 is a cross-sectional side view of the signal switching device along the line BB in FIG. 11.

FIG. 11 is a plan view of a signal switching device 100 according to a second embodiment of the present invention; FIG. 12 is a cross-sectional side view of the signal switching device 100 along the line AA in FIG. 11; and FIG. 13 is a cross-sectional side view of the signal switching device 100 along the line BB in FIG. 11.

The signal switching device 100 includes a switching section 102 that switches high frequency input signals to a first transmission path or a second transmission path as described below, a first transmission section 104 that is connected with the switching section 102 and forms the first transmission path, a serial transmission section 106 that is connected with the first transmission section 104, and a second transmission section 108 that is connected with the switching section 102 and forms the second transmission path. These transmission sections are formed by a coplanar wave guide. Strip conductors 112 and 114 are provided at centers of the first transmission section 104 and the serial transmission section 106, respectively, and grounding conductors 116, 118, 120, 122, and 124 are provided on the two sides of and at distances from the strip conductors 112 and 114.

The serial transmission section 106 is made from a superconducting material, and the switching section 102 and the first transmission section 104 are made from normal conducting materials. A parallel transmission section 130 is placed in the second transmission section 108 and between the strip conductor 112 and the grounding conductor 118. The parallel transmission section 130 is made from a superconducting material having a width of w4 along the signal transmission direction. In other words, the parallel transmission section 130 is connected with the strip conductor 112 in parallel. Meanwhile, the strip conductor 114 in the serial transmission section 106 is connected with the strip conductor 112 in series. The second transmission section 108 is made from a normal conducting material except for the parallel transmission section 130. As shown in FIG. 12 and FIG. 13, the structure shown in FIG. 11 is formed on a dielectric material 126.

The serial transmission section 106 and the parallel transmission section 130, which are made from superconducting materials, have high electrical resistances at temperatures higher than their critical temperatures (for example, 70K), and assume a superconducting state with extremely low electrical resistances when being cooled to temperatures lower than their critical temperatures. The same superconducting materials as described in the first embodiment may be used for forming the serial transmission section 106 and the parallel transmission section 130.

Although not illustrated in FIG. 11, a circuit is connected to the output of the serial transmission section 106 and is adjusted to match the serial transmission section 106 when the serial transmission section 106 is in the superconducting state; similarly, a circuit is connected to the output of the second transmission section 108 and is adjusted to match the second transmission section 108 when the parallel transmission section 130 is in the non-superconducting state.

Lengths and widths of the first transmission section 104 and the second transmission section 106, dielectric constant and thickness of the dielectric material 126, and sizes of gaps between the first transmission section 104 and the serial transmission section 106 with the grounding conductors 116, 119, 120, 122, and 124 are adjusted in order that the input impedance $Z_{XO1}$ from a branching point X of the first transmission path and the second transmission path to the first transmission path matches the characteristic impedance of the first transmission section 104 when the serial transmission section 106 is in the superconducting state.

In a section of a length L2 at the input end of the serial transmission section 106, the width of the strip conductor 114 is w1, much less than the width w2 of the strip conductor 114 at the output end. As described below, the purpose of making the input end of the strip conductor 114 thinner is to increase the electrical resistance of the strip conductor 114 when the serial transmission section 106 is in the non-superconducting state. In the present embodiment, the strip conductor 114 has a shape of a taper with its width varying continuously from a small value w1 to a large value w2, but the present invention is not limited to this, and any other shape may also be used. For example, the strip conductor 114 may have a stepwise shape. But, when varying the width of the strip conductor 114, it is necessary to maintain the-characteristic impedance of the transmission path unchanged. When a coplanar wave guide is used, it is necessary to adjust the width of the strip conductor 114 and the sizes of the gaps appropriately. That is, each gap is adjusted to be wide or narrow in connection with the width of the strip conductor 114 to keep the characteristic impedance constant. Therefore, as illustrated in FIG. 11, the gap in the region including the thinner portion of the strip conductor 114 is narrower than that of the thicker portion of the strip conductor 114.

The lengths L1, L2, and L3 of the transmission paths may be adjusted to the most appropriate values, for example, in the range from 0.1 to a few millimeters. The widths of the transmission paths may also take various values, for example, w1 may be set to 3 μm, and w2 may be set to 10 μm.

The parallel transmission section 130 is formed to have a very small width w4 and a path length L4. In the present embodiment, the parallel transmission section 130 is connected to the grounding conductor 118, and its length L4 is equal to half of the wavelength (abbreviated as "½ wavelength" when necessary) of the high frequency signals input to the switching section 102 from the outside, or a multiple of half of the wavelength. For this reason, the input impedance $Z_{O2}$ from a connection node $O_2$ of strip conductor 112 and the parallel transmission section 130 to the parallel transmission section 130 is substantially zero when the parallel transmission section 130 is in the superconducting state, and is substantially infinite (greater than a sufficiently large value) when the parallel transmission section 130 is in the non-superconducting state.

The operation of the switching device 100 is explained below. First, it is shown how to switch high frequency signals input to the switching section 102 to the second transmission path. In this case, the serial transmission section 106 and the parallel transmission section 130 are set to be in the non-superconducting state. Since the parallel transmission section 130 is long and thin, its impedance is very large under the non-superconducting condition, hence the signals propagated in the strip conductor 112 essentially do not enter the parallel transmission section 130. Therefore, the second transmission section 108, which forms the second transmission path, and the circuits connected thereto (not illustrated) match with each other, and the signals from the switching section 102 to the second transmission path formed by the second transmission section 108 can be well transmitted to the subsequent circuits.

Meanwhile, in the first transmission path, the first transmission section 104 does not match with the serial transmission section 106 that in the non-superconducting state. If the input impedance. $Z_{XO1}$ from the branching point X of the first transmission path and the second transmission path to the first transmission path is very large (ideally, infinite), signals input to the switching section 102 do not propagate to the first transmission path, but to the second transmission path with low signal loss. In the present embodiment, transmission path lengths L1 and L2 are adjusted so that the input impedance $Z_{XO1}$ is greater than a sufficiently large value (substantially approaching infinity). If the impedance of the serial transmission section 106 may be set sufficiently large by adjusting the length, width, and the electrical resistivity and dielectric constant under the non-superconducting condition, the distance (L1) from the branching point X of the first transmission path and the second transmission path to the serial transmission section 106 can be set to substantially zero.

Next, it is shown how to switch signals input to the switching section 102 to the first transmission path. In this case, the serial transmission section 106 and the parallel transmission section 130 are set to the superconducting state. As described above, the first transmission section 104 and the superconducting serial transmission section 106, which form the first transmission path, match with each other, and the signals from the switching section 102 to the first transmission path can be well transmitted to the later-stage circuits. On the other hand, since the parallel transmission section 130 is in the superconducting state, the input impedance from the strip conductor 112 to the parallel transmission section 130 is substantially zero. Thus, even if signals were propagated to the connection node $O_2$ of the strip conductor 112 and the parallel transmission section 130, the signals would not propagate to the later-stage circuits in the second transmission path, but to the parallel transmission section 130. However, In the present embodiment, the length L3 of the second transmission section 108 is adjusted so that the input impedance $Z_{XO2}$ viewed from the branching point X of the first transmission path and the second transmission path to the connection node $O_2$ becomes very large (substantially infinite) when the parallel transmission section 130 is in the super conducting state. In doing so, signals essentially do not propagate to the second transmission path, but to the first transmission path with low signal loss. Consequently, a switching device with low signal loss and good isolation quality is obtainable.

The method of adjusting transmission path lengths L1, L2, and L3 is the same as described in the first embodiment with reference to the Smith Chart in FIG. 2.

Figure 14:
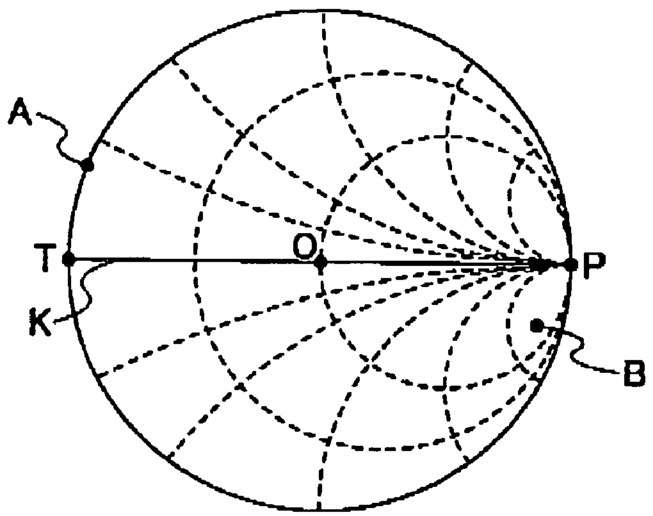
FIG. 14 shows a Smith chart presenting variation of input impedance.

Next, it is described how to adjust transmission path lengths L1, L2, and L3 with reference to Smith Charts in FIG. 2 and FIG. 14.

Specifically, when the serial transmission section 106 is in the superconducting state, the first transmission section 104 and the serial transmission section 106 match with each other, and the input impedance $Z_{XO1}$ of the first transmission path equals the characteristic impedance, that is, the input impedance $Z_{XO1}$ is at the origin O or the point Q near the origin O in FIG. 2. When the serial transmission section 106 is switched to the non-superconducting state, the input impedance $Z_{XO1}$ is at the point R at a distance from the origin O. In order to increase the input impedance $Z_{XO1}$, one needs to adjust the length L1 to move the point representing the impedance $Z_{XO1}$ to the cross-point R' of the circle I and the straight line K.

In the present embodiment, a section of the serial transmission section 106 having a length L2 is formed to have a path width w1 at the input end much less than the path width w2 at the output end; therefore, under the non-superconducting condition, the serial transmission section 106 has a very large resistance. Hence, when switching the serial transmission section 106 from the non-superconducting condition to the superconducting condition, or vice versa, the impedance $Z_{O1}$ changes greatly compared with a transmission path having a large and constant width. The impedances of the two states correspond to a small circle (its radius is substantially zero) and a large circle I in the Smith chart. With the large circle I, it is possible to adjust the input impedance $Z_{XO1}$ or $Z_{O1}$ to be much closer to the impedance corresponding to the point P (infinity).

Next, the parallel transmission section 130 is explained with reference to FIG. 14.

FIG. 14 shows a Smith chart presenting variation of input impedance.

The origin O of the Smith chart in FIG. 14 corresponds to the characteristic impedance of the coplanar wave guide in the present embodiment. First, when the parallel transmission section 130 is in the superconducting state, the electrical resistance of the parallel transmission section 130 is essentially zero. The length L4 of the parallel transmission section 130 is set to be half of the wavelength of the input signal. In this case, the input impedance $Z_{O2}$ from the connection node $O_2$ to the parallel transmission section 130 is at or near the leftmost point T. When setting the parallel transmission section 130 to the superconducting state to transmit signals to the first transmission path, it is necessary to adjust the length L3 of the second transmission path so that the input impedance $Z_{XO2}$ from the branching point X to the second transmission path is sufficiently large (ideally, infinite). Specifically, the same as the adjustment of the transmission path length L1, it is possible to find a value of the length L3 that makes the input impedance $Z_{XO2}$ substantially infinite by determining the phase angle between a point T and the point P.

When the parallel transmission section 130 is switched to the non-superconducting state, since the parallel transmission section 130 is long and thin, the input impedance $Z_{O2}$ is very large (substantially infinite). Therefore, in the Smith chart, the input impedance $Z_{O2}$ is at a point B near the point P. Consequently, when the input signals are transmitted to the first transmission path, the signal loss due to propagation of the signals to the second transmission path can be reduced quite effectively.

Figure 15:
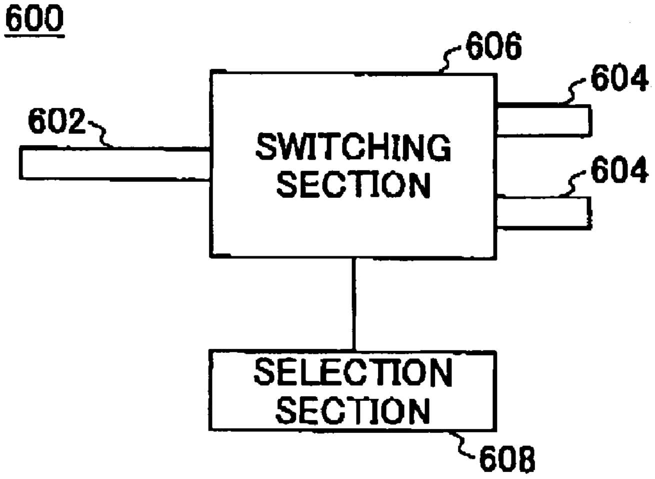
FIG. 15 is a schematic view showing an overall configuration of the signal switching device as illustrated in FIG. 1.

FIG. 15 is a schematic view showing an overall configuration of the signal switching device as illustrated in FIG. 1. In FIG. 15, the signal switching device 600 includes an input section 602, and a switching section 606 having a number of output channels 604. The signal switching device 600 also includes a selection section 608 connected to the switching section 606 for selecting a desired output channel. The switching section 606 has the same configuration as that shown in FIG. 1. The selection section 608, if appropriate, sets superconducting materials provided in transmission channels related to the output channels 604 to the superconducting state or to the non-superconducting state.

The switching section 608, for example, is capable of changing the conducting states of the superconducting materials by adjusting the magnitudes of the direct currents flowing in the superconducting materials or the magnetic fields applied to the superconducting materials. The switching section 608, for example, uses a heater to increase temperatures of the cooled superconducting materials to change the conducting states of the materials. In addition, the switching section 608, for example, uses a cooler to decrease temperatures of the superconducting materials presently in the non-superconducting state to change them to superconducting states. Namely, the switching section 608 includes a unit able to change the conducting states of the superconducting materials as desired so as to select a desired channel from the output channels 604.

Figure 16:
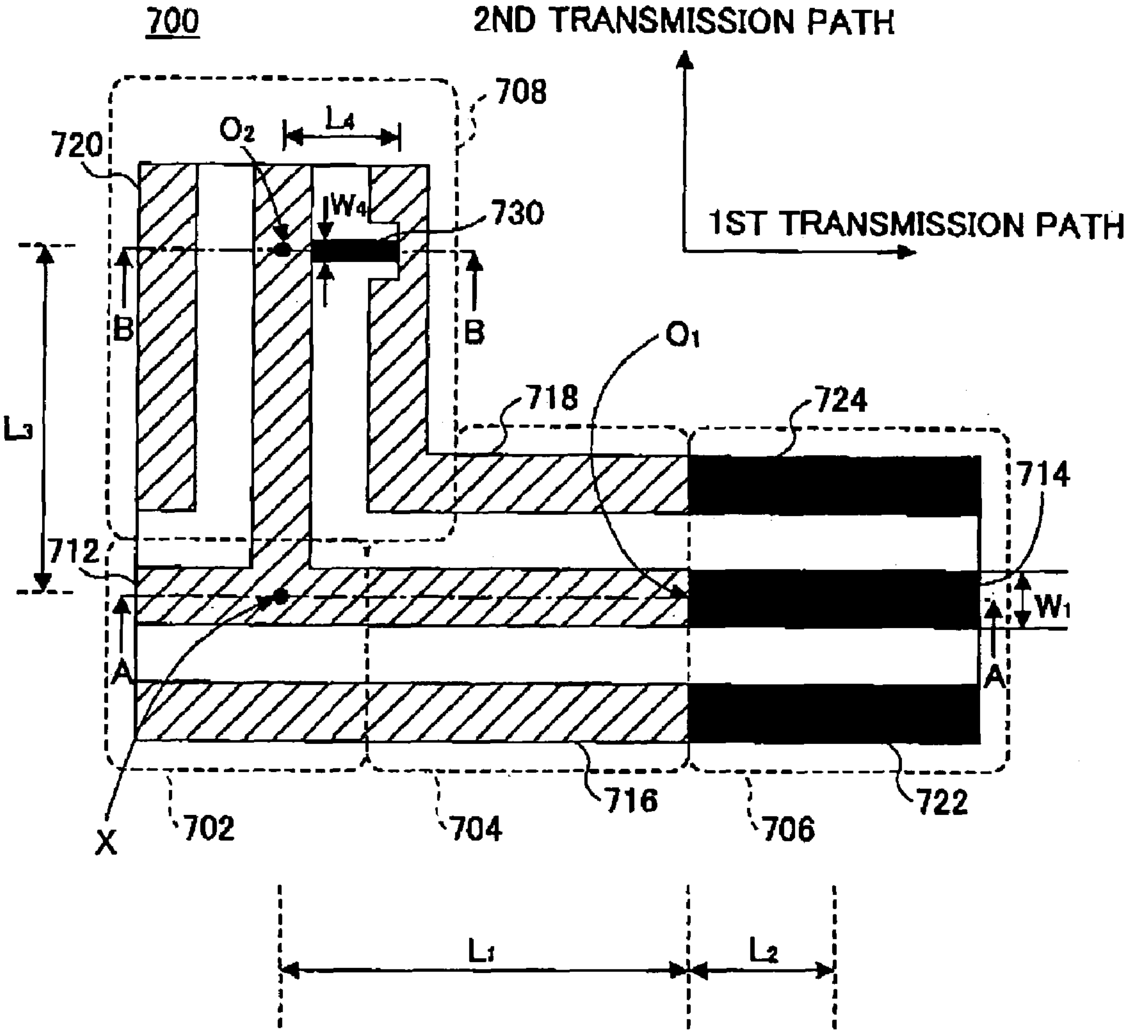
FIG. 16 is a plan view of a signal switching device as a modification to the second embodiment of the present invention.
Figure 17:
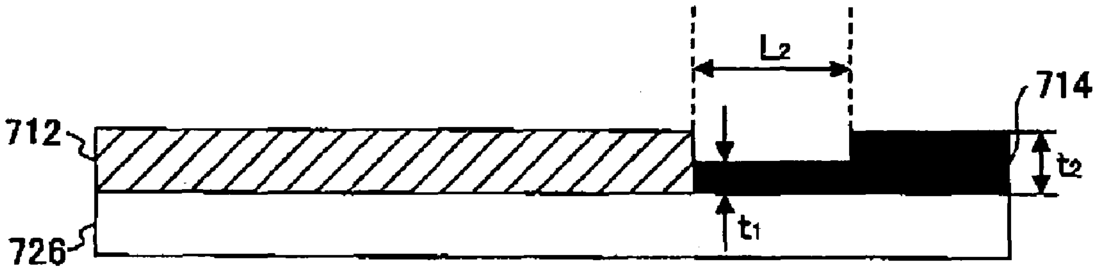
FIG. 17 is a cross-sectional side view of the signal switching device along the line AA in FIG. 16.
Figure 18:
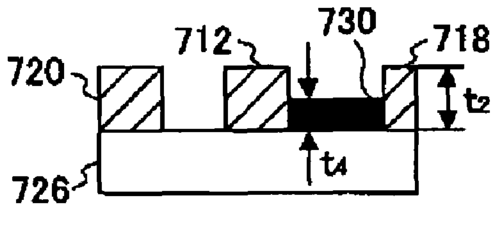
FIG. 18 is a cross-sectional side view of the signal switching device along the line BB in FIG. 16.

FIG. 16 is a plan view of a signal switching device 700 as a modification to the second embodiment of the present invention; FIG. 17 is a cross-sectional side view of the signal switching device 700 along the line AA in FIG. 16; and FIG. 18 is a cross-sectional side view of the signal switching device 700 along the line BB in FIG. 16.

Similar to the signal switching device 100 described above, the signal switching device 700 includes a switching section 702 that switches high frequency input signals to a first transmission path or a second transmission path, a first transmission section 704 that is connected with the switching section 702 and forms the first transmission path, a serial transmission section 706 that is connected with the first transmission section 704, and a second transmission section 708 that is connected with the switching section 702 and forms the second transmission path. These transmission sections are formed by a coplanar wave guide. Strip conductors 712 and 714 are provided passing through the center of the first transmission section 704 and the serial transmission section 706, respectively, and grounding conductors 716, 718, 720, 722, and 724 are provided on the two sides of and at distances from the strip conductors 712 and 714.

The serial transmission section 706 is made from a superconducting material, and the switching section 702 and the first transmission section 704 are made from normal conducting materials. A parallel transmission section 730 is placed in the second transmission section 708 and between the strip conductor 712 and the grounding conductor 718.

The parallel transmission section 730 is made from a superconducting material and has a width of w4 along the signal transmission direction. The second transmission section 708 is made from a normal conducting material except for the parallel transmission section 730. As shown in FIG. 17 and FIG. 18, the structure shown in FIG. 16 is formed on a dielectric material 726.

As illustrated in FIG. 16 and FIG. 17 in the present embodiment, the strip conductor 714 in the serial transmission section 706 is formed in such a way that the width of the strip conductor 714 at the input end is the same as that at the output end (indicated by w1), whereas the thickness t1 in a section of a length L2 at the input end of the serial transmission section 706 is less than that at the output end (t2). When the serial transmission section 706 is in the superconducting state, the thickness t1, dielectric constant and thickness of the dielectric material 726, and sizes of gaps between the first transmission section 704 and the serial transmission section 706 with the grounding conductors are adjusted so that the characteristic impedance of the first transmission section 704 matches that of the serial transmission section 706.

In the present embodiment, by providing a thin section in the serial transmission section 706, the electrical resistance of the serial transmission section 706 under the non-superconducting condition is large compared with the case in which the strip conductor 714 has a large and constant thickness.

In order to yield a large change of the input impedance $Z_{01}$ when switching the serial transmission section 106 from the non-superconducting condition to the superconducting condition, or vice versa, the section of a length L2 of the strip conductor 114 may be formed to have a smaller width but with a constant thickness, as illustrated in FIG. 1. Alternatively, as illustrated in FIG. 17 in the present embodiment, the section of a length L2 of the strip conductor 714 may be formed to have a smaller thickness but with a constant width.

Furthermore the structures shown in FIG. 11 and FIG. 17 may also be combined to form a strip conductor having both a smaller width and a smaller thickness. Thereby, it is possible to further increase the electrical resistance of the serial transmission section 706 under the non-superconducting condition.

In either case, a section of a specified length of the serial transmission section 706 has a smaller cross section than that of the output end of the transmission path, and thereby, the electrical resistance of the transmission section under the non-superconducting condition can be made large.

In the related art, when connecting a circuit having a different path width to the serial transmission section 706, usually, a connector has to be used between them to maintain a good connection condition so as to reduce signal loss at. the point of path width discontinuity. According to the present embodiments, by making the path width of the transmission section constant, such a connector is not necessary, the size of the device can be reduced by the size of the connector, and this in turn lowers the cost of the device.

As illustrated in FIG. 18, the parallel transmission section 730 is formed to have a very small thickness t4. The parallel transmission section 730 is connected to the grounding conductor 718, and its length is equal to half of the wavelength of the high frequency signals input to the switching section 702 from the outside, or a multiple of half of the wavelength. For this reason, the input impedance $Z_{O2}$ from the connection node $O_2$ of the strip conductor 712 and the parallel transmission section 730 to the parallel transmission section 730 is substantially zero when the parallel transmission section 730 is in the superconducting state, and is substantially infinite (greater than a sufficiently large value) when the parallel transmission section 730 is in the non-superconducting state.

The parallel transmission section 130 as illustrated in FIG. 11 is formed to have a small width w4 and a large thickness, whereas, in the present embodiment, as illustrated in FIG. 18, the parallel transmission section 730 is formed to have a large path width but small thickness.

In either case, by making the cross section of the parallel transmission section small, the electrical resistance of the parallel transmission section under th non-superconducting condition can be made large. Furthermore, it is possible to combine the structures as illustrated in FIG. 11 and FIG. 18 to form a parallel transmission section having a smaller path width w1 and a smaller thickness, and thereby, it is possible to further increase the electrical resistance of the parallel transmission section 730 under the non-superconducting condition.

The operation of the switching device 700 is the same as that of the switching device 100 described above. When high frequency signals input to the switching section 702 are switched to the second transmission path, the serial transmission section 706 and the parallel transmission section 730 are set to be in the non-superconducting state. Since the impedance of the parallel transmission section 730 is very large under the non-superconducting condition, the signals propagated in the strip conductor 712 essentially do not enter the parallel transmission section 730. Therefore, the second transmission section 708, which forms the second transmission path, and the subsequent circuits connected thereto (not illustrated) are in good matching condition, and the signals from the switching section 702 to the second transmission path formed by the second transmission section 708 can be well transmitted to the subsequent circuits.

Meanwhile, in the first transmission path, the first transmission section 704 does not match with the serial transmission section 706 that is in the non-superconducting state. Since the input impedance $Z_{XO1}$ from the branching point X of the first transmission path and the second transmission path to the first transmission path is very large, signals input to the switching section 702 do not propagate to the first transmission path, but to the second transmission path with low signal loss.

On the other hand, when signals input to the switching section 702 are switched to the first transmission path, the serial transmission section 706 and the parallel transmission section 730 are set to the superconducting state. As described above, the first transmission section 704 and the superconducting serial transmission section 706, which form the first transmission path, match with each other, and the signals from the switching section 702 to the first transmission path can be well transmitted to the subsequent circuits. Since the parallel transmission section 730 is in the superconducting state, the input impedance from the strip conductor 712 to the parallel transmission section 730 is substantially zero. However, In the present embodiment, the length L3 of the second transmission section 708 is adjusted so that the input impedance $Z_{XO2}$ viewed from the branching point X of the first transmission path and the second transmission path toward the connection node $O_2$ becomes very large (substantially infinite). In doing so, signals essentially do not propagate to the second transmission path, but to the first transmission path with low signal loss. Consequently, a switching device with low signal loss and good isolation quality is obtainable.

Third Embodiment

Figure 19:
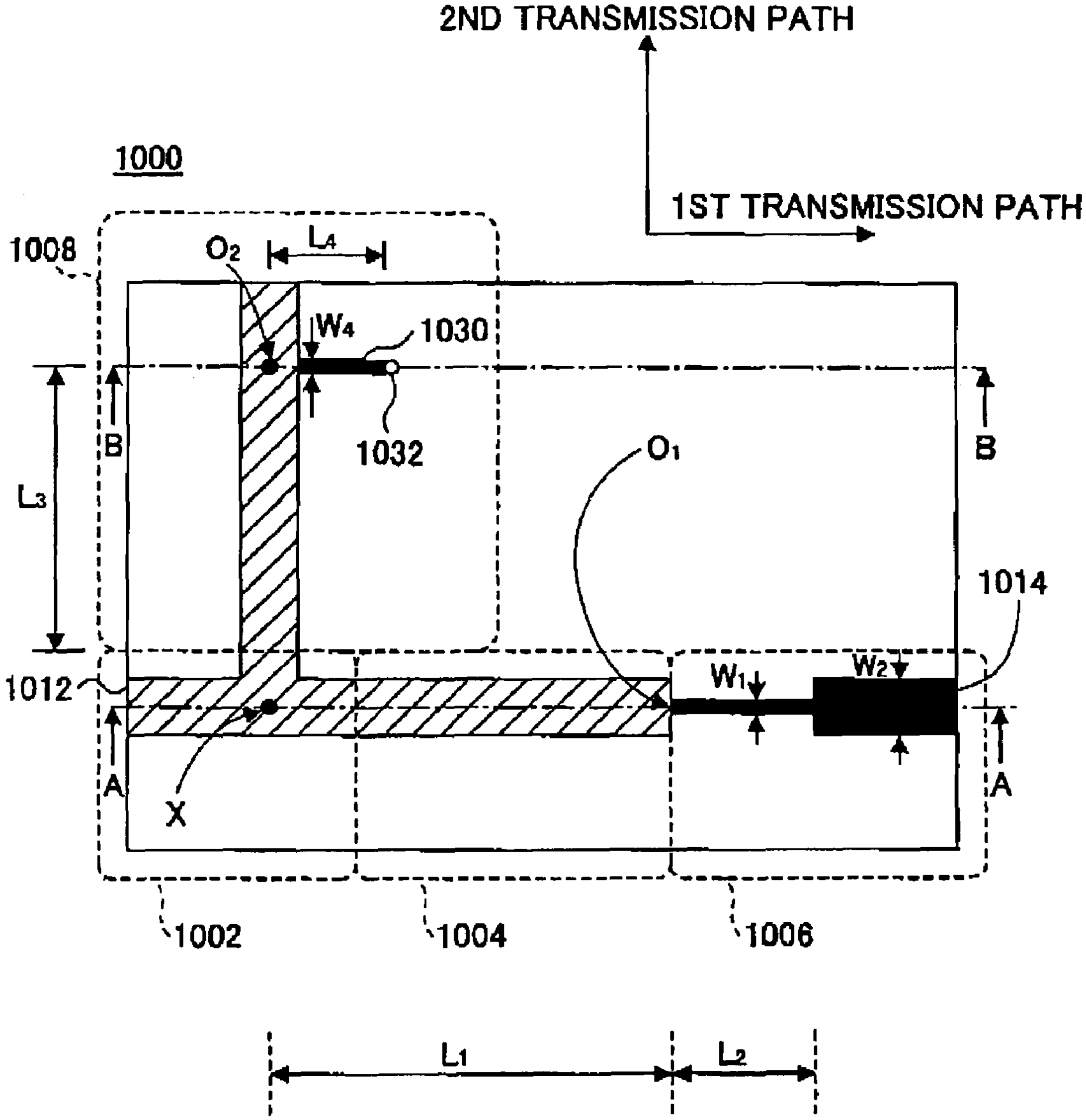
FIG. 19 is a plan view of a signal switching device according to a third embodiment of the present invention.
Figure 20:
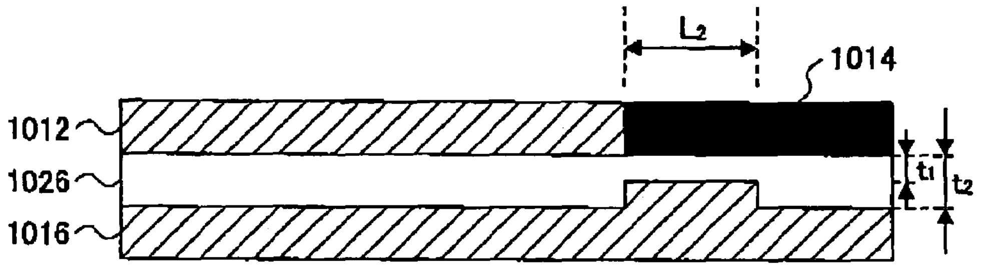
FIG. 20 is a cross-sectional side view of the signal switching device along the line AA in FIG. 19.
Figure 21:
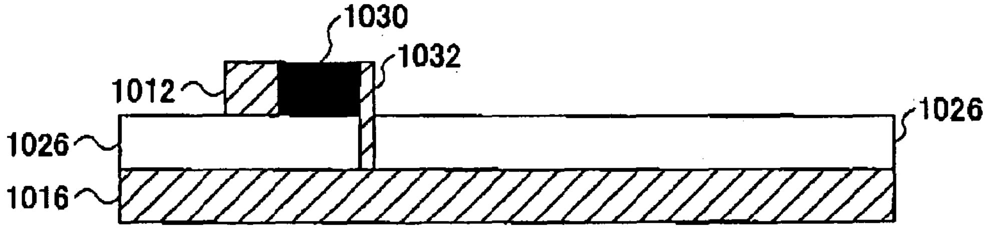
FIG. 21 is a cross-sectional side view of the signal switching device along the line BB in FIG. 19.

FIG. 19 is a plan view of a signal switching device 1000 according to a third embodiment of the present invention; FIG. 20 is a cross-sectional side view of the signal switching device 1000 along the line AA in FIG. 19; and FIG. 21 is a cross-sectional side view of the signal switching device 1000 along the line BB in FIG. 19.

The signal switching device 1000 includes a switching section 1002 that switches high frequency input signals to a first transmission path or a second transmission path, a first transmission section 1004 that is connected with the switching section 1002, a serial transmission section 1006 that is connected with the first transmission section 1004 and forms the first transmission path, and a second transmission section 1008 that is connected with the switching section 1002 and forms the second transmission path. These transmission sections are formed by micro-strip lines. As illustrated in FIG. 20 and FIG. 21, strip conductors 1012 and 1014 are formed on a dielectric material 1026 having a specified dielectric constant, and the dielectric material 1026 is provided on a grounding conductor 1016.

The serial transmission section 1006 is made from a superconducting material, and the switching section 1002 and the first transmission section 1004 are made from normal conducting materials. A parallel transmission section 1030 having a path width w4 and path length L4 and made from a superconducting material is provided with one end thereof in connection with the strip conductor 1012, and the other end thereof in connection with the grounding conductor 1016 through a conductive via hole 1032. In other words, the parallel transmission section 1030 is connected with the strip conductor 1012 in parallel. The second transmission section 1008 is made from a normal conducting material except for the parallel transmission section 1030.

The same superconducting materials as described above may be used for the serial transmission section 1006 and the parallel transmission section 1030.

In the present embodiment, the strip conductor 1014 in the serial transmission section 1006 is formed in such a way that the path width w1 in a section of a length L2 at the input end is less than the path width w2 at the output end, whereas the thickness of the section of a width w1 is the same as the thickness at the output end.

The characteristic impedance of a micro-strip guide wave depends on the width of the transmission path, thickness of the dielectric material 1026 (that is, distance from the strip conductor 1012 to the grounding conductor 1016), and the dielectric constant of the dielectric material 1026. Therefore, in order to maintain a constant characteristic impedance in the transmission path through the serial transmission section 1006 even when its path width changes, the thickness t1 of the dielectric layer 1026 in the section of the width w1 is formed to be less than the thickness t2 at the output end of the dielectric layer 1026.

In the present embodiment, because a thin section is provided in the serial transmission section 1006, under the non-superconducting condition, the serial transmission section 1006 has a very large resistance compared with a transmission path having a large and constant width.

Figure 22:
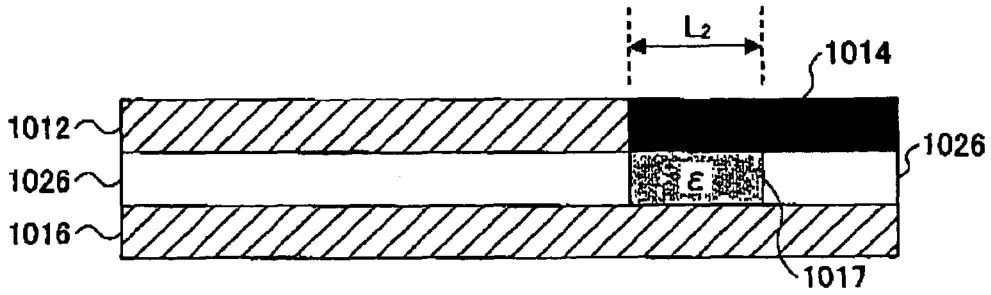
FIG. 22 is a cross-sectional side view of a modification to the signal switching device in FIG. 19.

FIG. 22 is a cross-sectional side view of a modification to the signal switching device 1000 along the line AA in FIG. 19.

As illustrated in FIG. 22, in the section of a length L2, where the thickness of the dielectric material 1026 ought to be changed, a dielectric material 1017 having a different dielectric constant from the dielectric material 1026 may be used. In doing so, the distance from the strip conductor 1014 to the grounding conductor 1016 can be maintained to be a constant (t2) in the entire region.

In the present embodiment, as illustrated in FIG. 19 and FIG. 21, the parallel transmission section 1030 is formed to have a very small path width w4, but a large thickness t4. The parallel transmission section 1030 is connected to the grounding conductor 1016, and its length is equal to half of the wavelength of the high frequency signals input to the switching section 1002, or a multiple of half of the wavelength. For this reason, the input impedance $Z_{O2}$ from the connection node $O_2$ of the strip conductor 1012 and the parallel transmission section 1030 to the parallel transmission section 1030 is substantially zero when the parallel transmission section 1030 is in the superconducting state, and is substantially infinite (greater than a sufficiently large value) when the parallel transmission section 1030 is in the non-superconducting state.

Path lengths L1, L2, and L3 are adjusted in the same way as described above.

The operation of the switching device 1000 is the same as that of the switching device 100 described above. When high frequency signals input to the switching section 1002 are switched to the second transmission path, the serial transmission section 1006 and the parallel transmission section 1030 are set to be in the non-superconducting state. Since the impedance of the parallel transmission section 1030 is very large under the non-superconducting condition, the signals propagated in the strip conductor 1012 essentially do not enter the parallel transmission section 1030. Therefore, the second transmission section 1008, which forms the second transmission path, and the subsequent circuits connected thereto (not illustrated) are in good matching condition, and the signals from the switching section 1002 to the second transmission path formed by the second transmission section 1008 can be well transmitted to the subsequent circuits.

Meanwhile, in the first transmission path, the first transmission section 1004 does not match with the serial transmission section 1006 that is in the non-superconducting state. Since the input impedance $Z_{XO1}$ from the branching point X of the first transmission path and the second transmission path to the first transmission path is very large, signals input to the switching section 1002 do not propagate to the first transmission path, but to the second transmission path with low signal loss.

On the other hand, when signals input to the switching section 1002 are switched to the first transmission path, the serial transmission section 1006 and the parallel transmission section 1030 are set to the superconducting state. As described above, the first transmission section 1004 and the superconducting serial transmission section 1006, which form the first transmission path, match with each other, and the signals from the switching section 1002 to the first transmission path can be well transmitted to the subsequent circuits. Meanwhile, since the parallel transmission section 1030 is in the superconducting state, the input impedance from the strip conductor 1012 to the parallel transmission section 1030 is substantially zero However, in the present embodiment, the length L3 of the second transmission section 1008 is adjusted so that the input impedance $Z_{XO2}$ viewed from the branching point X of the first transmission path and the second transmission path toward the connection node $O_2$ becomes very large (substantially infinite). Thereby, signals essentially do not propagate to the second transmission path, but to the first transmission path with low signal loss. Consequently, a switching device with low signal loss and good isolation quality is obtainable.

Figure 23:
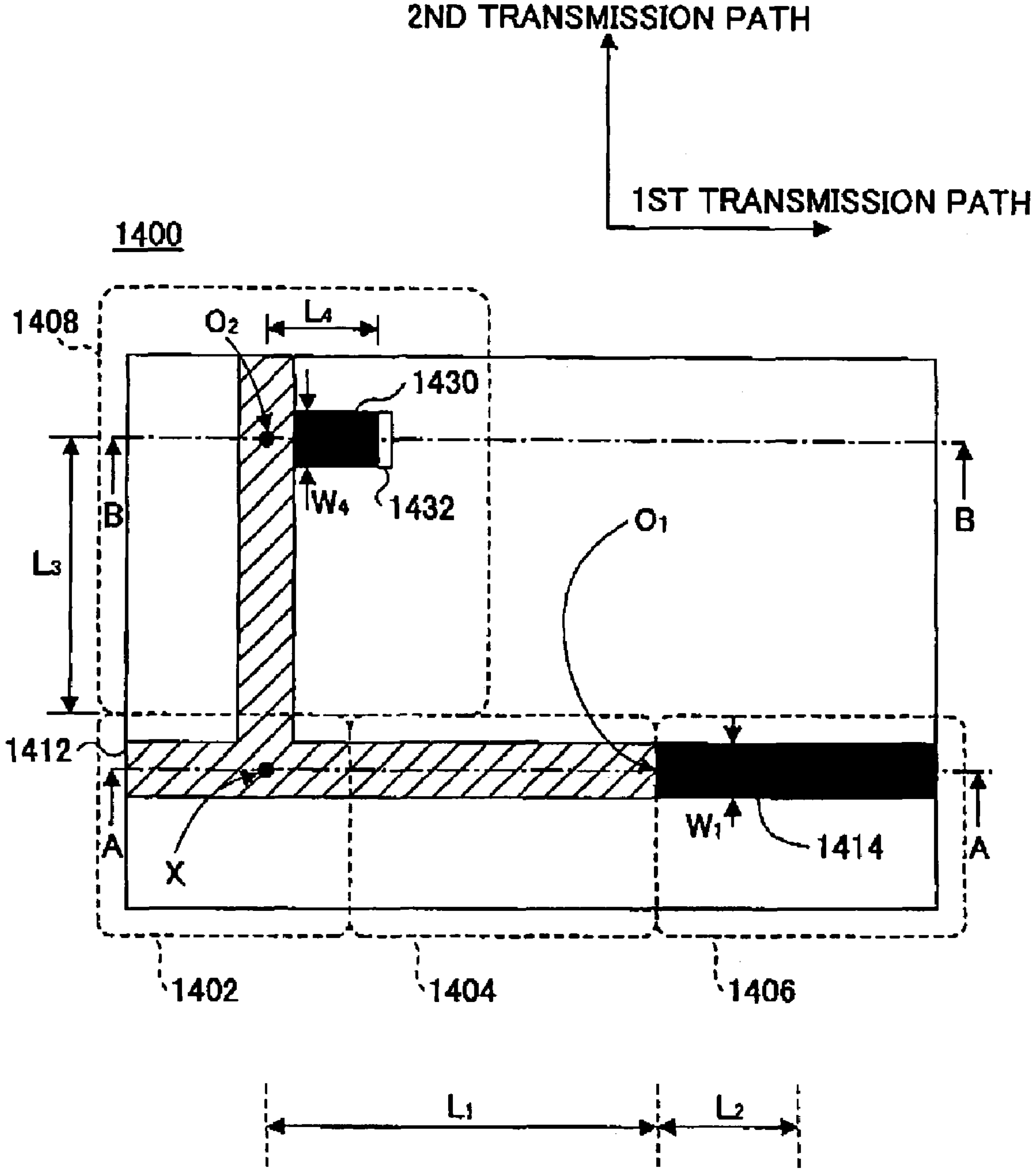
FIG. 23 is a plan view of a signal switching device as a modification to the third embodiment of the present invention.
Figure 24:
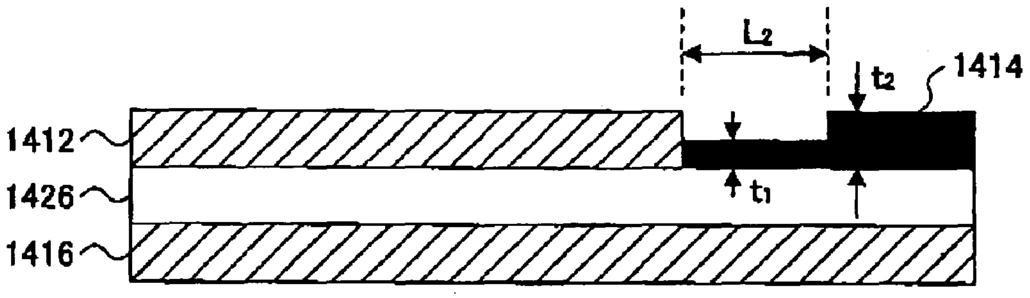
FIG. 24 is a cross-sectional side view of the signal switching device along the line AA in FIG. 23.
Figure 25:
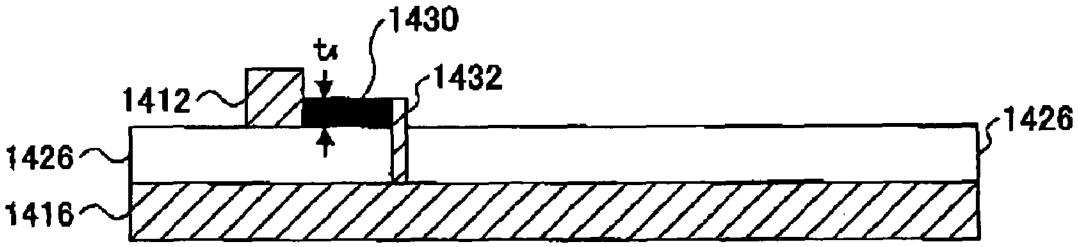
FIG. 25 is a cross-sectional side view of the signal switching device along the line BB in FIG. 23.

FIG. 23 is a plan view of a signal switching device 1400 as a modification to the third embodiment of the present invention; FIG. 24 is a cross-sectional side view of the signal switching device 1400 along the line AA in FIG. 23; and FIG. 25 is a cross-sectional side view of the signal switching device 1000 along the line BB in FIG. 23.

The signal switching device 1400 includes a switching section 1402 that switches high frequency input signals to a first transmission path or a second transmission path, a first transmission section 1404 that is connected with the switching section 1402 and forms the first transmission path, a serial transmission section 1406 that is connected with the first transmission section 1404, and a second transmission section 1408 that is connected with the switching section 1402 and forms the second transmission path. These transmission sections are formed by a micro-strip line. As illustrated in FIG. 24 and FIG. 25, strip conductors 1412 and 1414 are formed on a dielectric material 1426 having a specified dielectric constant, and the dielectric material 1426 is provided on a grounding conductor 1416.

The serial transmission section 1406 is made from a superconducting material, and the switching section 1402 and the first transmission section 1404 are made from normal conducting materials. A parallel transmission section 1430 having a path width w4 and path length L4 and made from a superconducting material is provided with one end thereof in connection with the strip conductor 1412, and the other end thereof in connection with the grounding conductor 1416 through a conductive via hole 1432. The second transmission section 1408 is made from a normal conducting material except for the parallel transmission section 1430.

The same superconducting materials as described above may be used for the serial transmission section 1006 and the parallel transmission section 1030.

In this example, the strip conductor 1414 in the serial transmission section 1406 is formed in such a way that the path width w1 in a section of a length L2 at the input end is the same as the path width at the output end, whereas the thickness t1 of the section of a width w1 is less than the thickness t2 at the output end.

Because a thin section is provided in the serial transmission section 1406, under the non-superconducting condition, the serial transmission section 1406 has a very large resistance compared with a transmission path having a large and constant thickness.

As illustrated in FIG. 23 and FIG. 25, the parallel transmission section 1430 is formed to have a very small path thickness t4 but a relatively large width w4, The parallel transmission section 1430 is connected to the grounding conductor 1416, and its length is equal to half of the wavelength of the high frequency signals input to the switching section 1402, or a multiple of half of the wavelength. For this reason, the input impedance $Z_{O2}$ from the connection node $O_2$ of the strip conductor 1412 and the parallel transmission section 1430 to the parallel transmission section 1430 is substantially zero when the parallel transmission section 1430 is in the superconducting state, and is substantially infinite (greater than a sufficiently large value) when the parallel transmission section 1430 is in the non-superconducting state.

In order to yield a large change of the input impedance $Z_{o1}$ when switching the serial transmission section 1406 from the non-superconducting condition to the superconducting condition, or vice versa, as illustrated in FIG. 19, the section of a length L2 of the strip conductor 1014 may be formed to have a smaller width but with a constant thickness. Alternatively, as illustrated in FIG. 23 in this example, the section of a length L2 of the strip conductor 1414 may be formed to have a smaller thickness but with a relatively large width.

Furthermore, it is possible to combine the structures as illustrated in FIG. 19 and FIG. 24 and FIG. 25 to form a strip conductor having a smaller width and a smaller thickness, and thereby, it is possible to further increase the electrical resistance of the serial transmission section 1406 under the non-superconducting condition.

In either case, by forming a section in a transmission path having a smaller cross section than that of the output end of the transmission path, the electrical resistance of the transmission section under the non-superconducting condition can be made large.

Path lengths L1, L2, and L3 are adjusted in the same way as described above.

The operation of the switching device 1400 is the same as that of the switching device 100 described above. When high frequency signals input to the switching section 1402 are switched to the second transmission path, the serial transmission section 1406 and the parallel transmission section 1430 are set to be in the non-superconducting state. Since the impedance of the parallel transmission section 1430 is very large under the non-superconducting condition, the signals propagated in the strip conductor 1412 essentially do not enter the parallel transmission section 1430. Therefore, the second transmission section 1408, which forms the second transmission path, and the subsequent circuits connected thereto (not illustrated) are in good matching condition, and the signals from the switching section 1402 to the second transmission path formed by the second transmission section 1408 can be well transmitted to the subsequent circuits.

Meanwhile, in the first transmission path, the first transmission section 1404 does not match with the serial transmission section 1406 that is in the non-superconducting state. Since the input impedance $Z_{XO1}$ from the branching point X of the first transmission path and the second transmission path to the first transmission path is very large, signals input to the switching section 1402 do not propagate to the first transmission path, but to the second transmission path with low signal loss.

On the other hand, when signals input to the switching section 1402 are switched to the first transmission path, the serial transmission section 1406 and the parallel transmission section 1430 are set to the superconducting state. As described above, the first transmission section 1404 and the superconducting serial transmission section 1406, which form the first transmission path, match with each other, and the signals from the switching section 1402 to the first transmission path can be well transmitted to the subsequent circuits. Meanwhile, since the parallel transmission section 1430 is in the superconducting state, the input impedance from the strip conductor 1412 to the parallel transmission section 1430 is substantially zero. However, in this example, the length L3 of the second transmission section 1408 is adjusted so that the input impedance $Z_{XO2}$ viewed from the branching point X of the first transmission path and the second transmission path toward the connection node $O_2$ becomes very large (substantially infinite). Thereby, signals essentially do not propagate to the second transmission path, but to the first transmission path with low signal loss. Consequently, a switching device with low signal loss and good isolation quality is obtainable.

Fourth Embodiment

Figure 26:
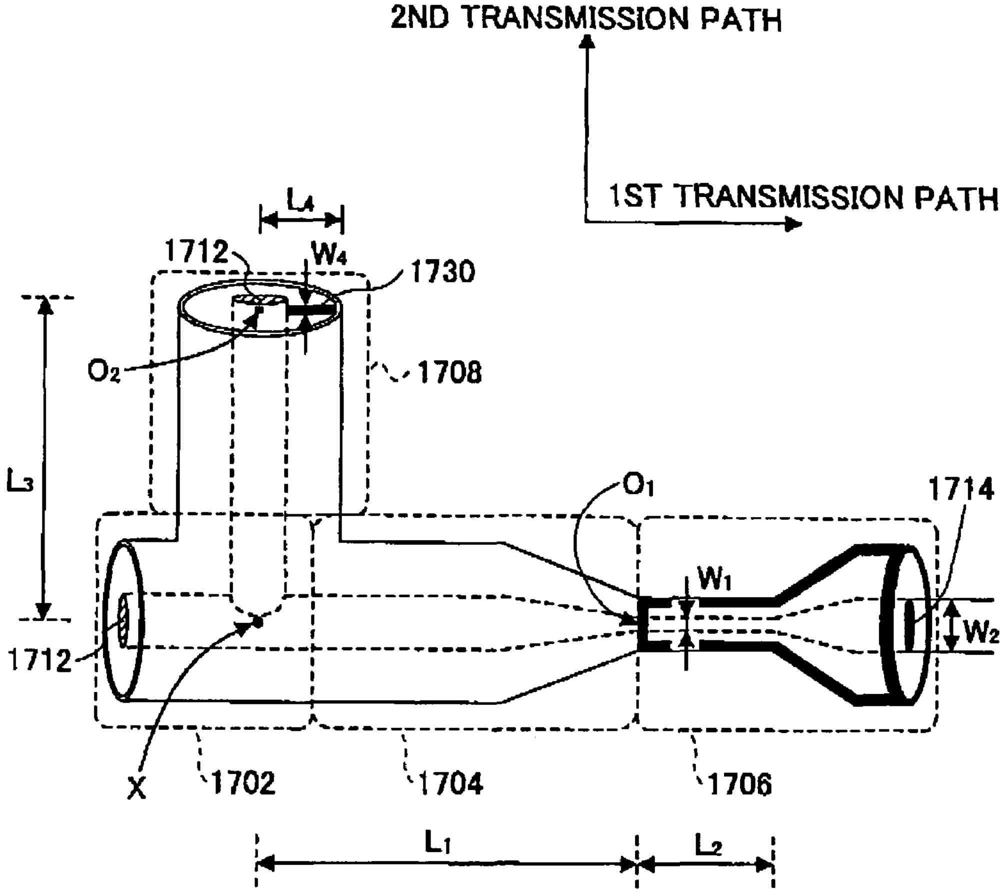
FIG. 26 is a plan view of a signal switching device according to a fourth embodiment of the present invention.

FIG. 26 is a plan view of a signal switching device 1700 according to a fourth embodiment of the present invention. Different from the previous embodiments, the signal switching device 1700 is formed by a co-axial line.

The signal switching device 1700 includes a switching section 1702 that switches high frequency input signals to a first transmission path or a second transmission path, a first transmission section 1704 that is connected with the switching section 1702 and forms the first transmission path, a serial transmission section 1706 that is connected with the first transmission section 1704, and a second transmission section 1708 that is connected with the switching section 1702 and forms the second transmission path. The conductor 1714 at the center of the serial transmission section 1706 is made from a superconducting material, and the switching section 1702 and a conductor 1712 at the center of the first transmission section 1704 are made from normal conducting materials.

In the second transmission section 1708, a parallel transmission section 1730 is provided between the conductor 1712 and the peripheral grounding conductor. The parallel transmission section 1730 has a path width w4 and a path length L4, and is made from a superconducting material In other words, the parallel transmission section 1730 is connected with the conductor 1712 in parallel. The second transmission section 1708 includes a central conductor 1712, a dielectric material surrounding the conductor 1712, a peripheral grounding conductor, and the parallel transmission section 1730.

In the present embodiment, the conductor 1714 in the serial transmission section 1706 is formed in such a way that the diameter w1 of a section of a length L2 at the input end is less than the diameter w2 at the output end, and the diameter of the cable including the conductor 1714 in the section of a length L2 is also less than the diameter of the cable at the output end.

The characteristic impedance of a co-axial cable depends on the diameter of the conducting material, thickness of the dielectric material (that is, distance from the central conductor to the grounding conductor), and the dielectric constant of the dielectric material. Therefore, in order to maintain a constant characteristic impedance for the transmission path through the serial transmission section 1706 even when the diameter of the conductor changes, the thickness t1 of the dielectric material in the section of a smaller diameter w1 is formed to be less than the thickness of the dielectric material at the output end.

When the serial transmission section 1706 is in the superconducting state, the diameter of the conductor 1714, the dielectric constant and diameter of the dielectric material are adjusted so that the characteristic impedance of the first transmission section 1704 matches the characteristic impedance of the serial transmission section 1706.

In the present embodiment, because a thin section is provided in the serial transmission section 1706, under the non-superconducting condition, the serial transmission section 1706 has a very large resistance compared with a transmission path having a large and constant thickness.

Similar to the co-planar wave guide and the micro-strip line, in order to yield a large change of the input impedance $Z_{O1}$ and $Z_{O2}$ when switching from the non-superconducting condition to the superconducting condition, or vice versa, it is preferable that sections of lengths L2 and L4 of the conductors 1714 and 1730, respectively, be formed to have smaller cross sections.

Here, path lengths L1, L2, L3, and L4 are adjusted in the same way as in the previous embodiments.

The operation of the switching device 1700 is the same as that of the switching device 100 described above. When high frequency signals input to the switching section 1702 are switched to the second transmission path, the serial transmission section 1706 and the parallel transmission section 1730 are set to be in the non-superconducting state. Since the parallel transmission section 1730 is relatively long and thin, the impedance of the parallel transmission section 1730 is very large under the non-superconducting condition, and the signals propagated in the conductor 1712 essentially do not enter the parallel transmission section 1730. Therefore, the second transmission section 1708, which forms the second transmission path, and the subsequent circuits connected thereto (not illustrated) are in good matching condition, and the signals from the switching section 1702 to the second transmission path formed by the second transmission section 1708 can be well transmitted to the subsequent circuits.

Meanwhile, in the first transmission path, the first transmission section 1704 does not match with the serial transmission section 1706 that is in the non-superconducting state. Since the input impedance $Z_{XO1}$ from the branching point X of the first transmission path and the second transmission path to the first transmission path is very large, signals input to the switching section 1702 do not propagate to the first transmission path, but to the second transmission path with low signal loss.

On the other hand, when signals input to the switching section 1702 are switched to the first transmission path, the serial transmission section 1706 and the parallel transmission section 1730 are set to the superconducting state. As described above, the first transmission section 1704 and the superconducting serial transmission section 1706, which form the first transmission path, match with each other, and the signals from the switching section 1702 to the first transmission path can be well transmitted to the subsequent circuits. Meanwhile, since the parallel transmission section 1730 is in the superconducting state, the input impedance from the strip conductor 1712 to the parallel transmission section 1730 is substantially zero. However, in the present embodiment, the length L3 of the second transmission section 1708 is adjusted so that the input impedance $Z_{XO2}$ viewed from the branching point X of the first transmission path and the second transmission path toward the connection node $O_2$ becomes very large (substantially infinite). Thereby, signals essentially do not propagate to the second transmission path, but to the first transmission path with low signal loss. Consequently, a switching device with low signal loss and good isolation quality is obtainable.

Fifth Embodiment

Figure 27:
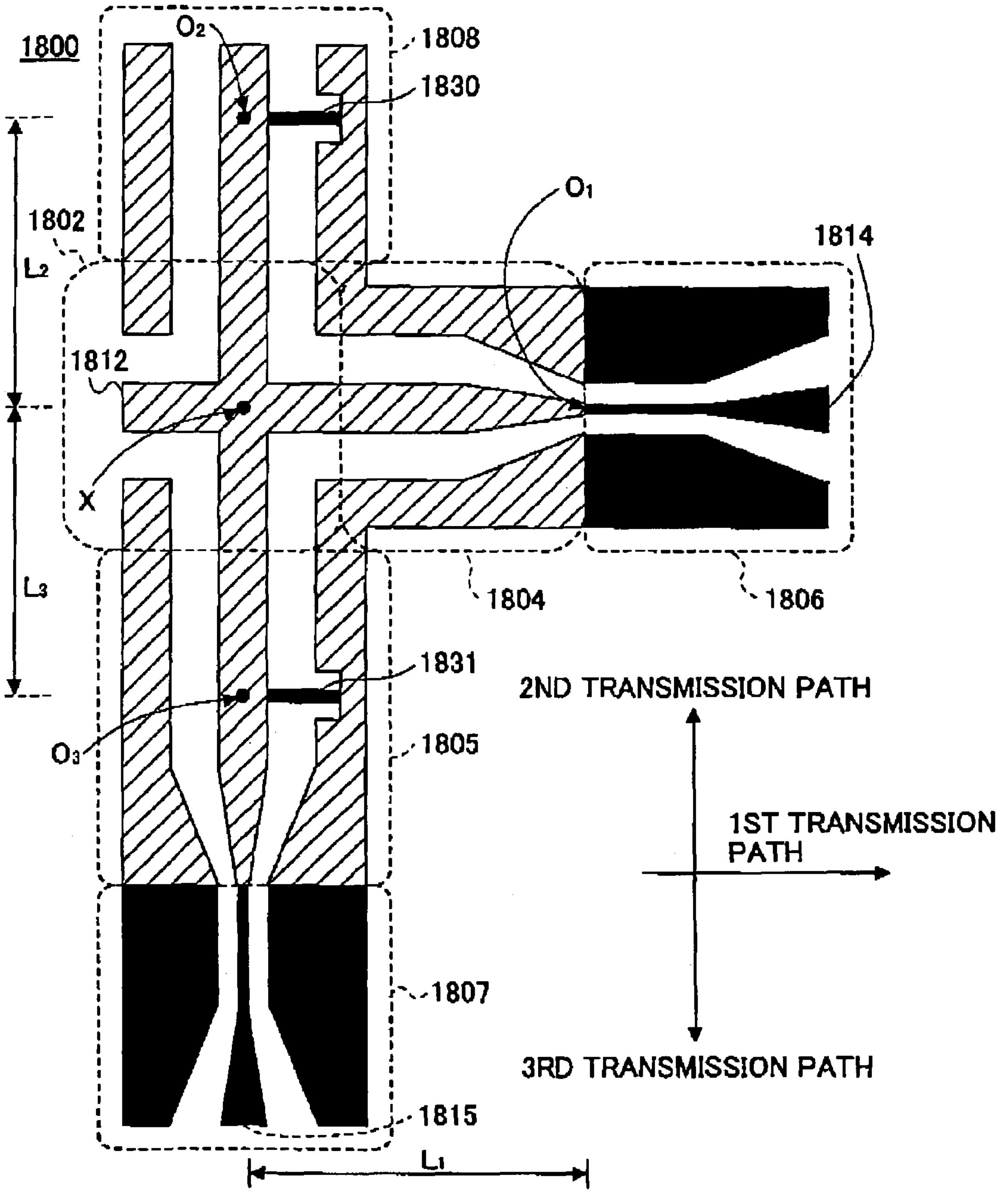
FIG. 27 is a plan view of a signal switching device according to a fifth embodiment of the present invention.

FIG. 27 is a plan view of a signal switching device 1800 according to a fifth embodiment of the present invention. Different from the previous embodiments, the signal switching device 1800 has three transmission paths.

The signal switching device 1800 includes a switching section 1802 that switches high frequency input signals to a first transmission path, a second transmission path, or a third transmission path; a first transmission section 1804 that is connected with the switching section 1802 and forms the first transmission path, a serial transmission section 1806 that is connected with the first transmission section 1804, a second transmission section 1808 that is connected with the switching section 1802 and forms the second transmission path, a third transmission section 1805 that is connected with the switching section 1802 and forms the third transmission path, and a serial transmission section 1807 that is connected with the third transmission section 1805. The above transmission sections are formed by a coplanar wave guide. Strip conductors 1812, 1814 and 1815 are provided at centers of the first transmission section 1804, the serial transmission section 1806, the second,transmission section 1808, the third transmission section 1805, and the serial transmission section 1807, respectively, and grounding conductors are provided on the two sides of and at distances from the strip conductors 1812, 1814, and 1815.

The serial transmission section 1806 of the first transmission path and the serial transmission section 1807 of the third transmission path are made from superconducting materials, and the switching section 1802, the first transmission section 1804 and the third transmission section 1805 are made from normal conducting materials. A parallel transmission section 1830 made from a superconducting material is placed in the second transmission section 1808 and between the strip conductor 1812 and the grounding conductor. A parallel transmission section 1831, also made from a superconducting material, is placed in the third transmission section 1805 and between the strip conductor 1812 and the grounding conductor. The second transmission section 1808 is made from a normal conducting material except for the parallel transmission section 1830, and the third transmission section 1805 is made from a normal conducting material except for the parallel transmission section 1831. Path lengths L1, L2, and L3 are adjusted in the same way as described above.

The same superconducting materials may be used as described before. However, in the present embodiment, for simplicity of explanation, it is assumed that the superconducting material of the serial transmission section 1806 of the first transmission path and the superconducting material of the parallel transmission section 1831 of the third transmission path have the same critical temperature (referred to as the first critical temperature $T_{C1}$), and the superconducting material of the serial transmission section 1807 of the third transmission path and the superconducting material of the parallel transmission section 1830 of the second transmission path have the same critical temperature (referred to as the second critical temperature $T_{C2}$), and the second critical temperature $T_{C2}$ is higher than the first critical temperature $T_{C1}$ ($T_{C2}>T_{C1}$)

As described with reference to FIG. 11 and FIG. 19, the strip conductor 1814 in the serial transmission section 1806 and the strip conductor 1815 in the serial transmission section 1807 are formed in such a way that the path widths w1 in sections having specified lengths at their input ends are much less than the path widths w2 at their output ends. The parallel transmission sections 1830 and 1831 are formed to have very small path widths w4 and path lengths L4. In the present embodiment, the parallel transmission sections 1830 and 1831 of the second transmission path and the third transmission path, respectively, are connected to grounding conductors, and their lengths are equal to half of the wavelength of the high frequency signals input to the switching section 1802 from the outside, or a multiple of half of the wavelength.

Next, the operation of the switching device 1800 is explained below. When high frequency signals input to the switching section 1802 are switched to the first transmission path, all the superconducting materials are set to temperatures lower than the first critical temperature $T_{C1}$. Therefore, all the superconducting materials are in the superconducting state. In this case, the first transmission section 1804 matches with the subsequent circuits (not illustrated), and signals are well transmitted to the later-stage circuits. In the second transmission path, the input impedance $Z_{O2}$ of the parallel transmission section 1830 is essentially zero, but the path length L2 of the second transmission path is adjusted so that the input impedance $Z_{XO2}$ from the branching point X to the second transmission path is substantially infinite. Therefore, no signal propagates to the second transmission path. Similarly, in the third transmission path, the input impedance $Z_{O3}$ of the parallel transmission section 1831 and the serial transmission section is essentially zero, but the path length L3 of the third transmission path is adjusted so that the input impedance $Z_{XO3}$ from the branching point X to the third transmission path is substantially infinite. Therefore, no signal propagates to the third transmission path, either. Consequently, signals propagate to the first transmission path with low signal loss.

When the high frequency signals input to the switching section 1802 are switched to the third transmission path, all the superconducting materials are set to temperatures higher than the first critical temperature $T_{C1}$ and lower than the second critical temperature $T_{C2}$. Therefore, the serial transmission section 1806 in the first transmission path and the parallel transmission section 1831 in the third transmission section 1805 are in the non-superconducting state, and the serial transmission section 1807 in the third transmission path and the parallel transmission section 1830 in the second transmission section 1808 are in the superconducting state. In this case, because the parallel transmission section 1831 in the third transmission section 1805 is in the non-superconducting state, the impedance is very large, and signals do not propagate to the parallel transmission section 1831. The serial transmission section 1807 in the third transmission path is in the superconducting state, and matches with the subsequent circuits, and therefore, signals propagate in good condition. The first transmission path is in the non-superconducting state, and does not match with the subsequent circuits, therefore, the input impedance is large, and essentially no signals propagate to the first transmission path, With respect to the second transmission path, the input impedance $Z_{O2}$ of the parallel transmission section 1830 is essentially zero, but the path length L2 of the second transmission path is adjusted so that the input impedance $Z_{XO2}$ from the branching point X to the second transmission path is substantially infinite. Therefore, no signal propagates to the second transmission path, either. Consequently, signals propagate to the third transmission path with low signal loss.

When the high frequency signals input to the switching section 1802 are switched to the second transmission path, all the superconducting materials are set to temperatures higher than the second critical temperature $T_{C2}$. Therefore, all the superconducting materials are in the non-superconducting state. In this case, since the parallel transmission section 1830 in the second transmission section 1808 is in the non-superconducting state, and the input impedance is essentially infinite, no signal propagates to the parallel transmission section 1830. The second transmission section 1808 is in the normal state, and matches with the subsequent circuits, and therefore, signals propagate in good condition. The first transmission path is in the non-superconducting state, and the serial transmission section 1806 does not match with the subsequent circuits, therefore, the input impedance is large, and essentially no signal propagates to the first transmission path. Similarly, in the third transmission path, the serial transmission section. 1807 does not match with the subsequent circuits, therefore, the input impedance is large, and essentially no signal propagates to the third transmission path, either. Consequently, signals propagate to the second transmission path with low signal loss.

As shown above, by appropriately combining serial transmission sections and parallel transmission sections formed from superconducting materials having different critical temperatures, it is possible to switch two or more signals appropriately. In the present embodiment, the case of using two superconducting materials having different critical temperatures is described, but more kinds of superconducting materials may be used to switch signals to more paths. In addition, it is described that all the transmission sections formed from superconducting materials are set to be at the same temperature, but it is also possible to control each of the transmission sections separately.

Sixth Embodiment

In the above embodiments, the parallel transmission section is formed to have a length equal to half of the wavelength of the input signals or a multiple of half of the wavelength of the input signals. It should be noted that the present invention is not limited to this, and the length of the parallel transmission section may also equal a quarter of the wavelength of the input signals or an odd multiple of a quarter of the wavelength of the input signals.

Figure 28:
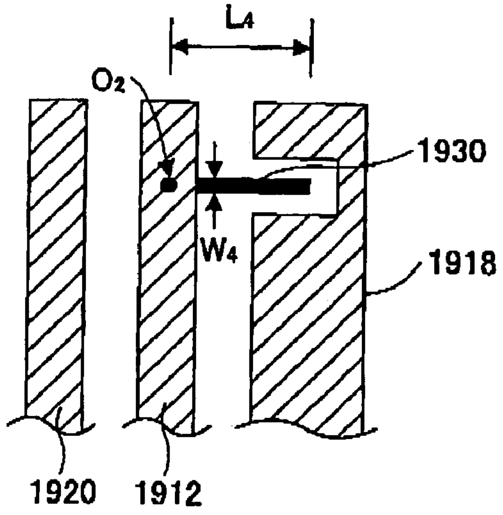
FIG. 28 is a plan view of a portion of a signal switching device according to a sixth embodiment of the present invention.

FIG. 28 is a plan view of a portion of a signal switching device 1900 according to a sixth embodiment of the present invention, illustrating the second transmission section and the parallel transmission section described in the previous embodiments. In FIG. 28, it is illustrated that the transmission sections are formed by a coplanar wave guide, but these transmission sections may also be formed by a micro-strip line or a co-axial line. In FIG. 28, the strip conductor 1912 is provided at specified distances from grounding conductors 1918 and 1920. A parallel transmission section 1930 is provided with one end thereof in connection with the strip conductor 1912, and the other end thereof being open. The parallel transmission section 1930 has a path width w4 and a path length equal to a quarter of the wavelength of the input signals, or in general, an odd multiple of a quarter of the wavelength. By setting the path length of the parallel transmission section 1930 in this way, the input impedance $Z_{O2}$ of the parallel transmission section 1930 is substantially zero when the parallel transmission section 1930 is in the superconducting state. This is the same as the case in which the parallel transmission section is connected with the grounding conductor and the path length of the parallel transmission section is set to be half of the wavelength of the input signals or a multiple of half of the wavelength.

Below is a more detailed explanation. As already described, when the parallel transmission section is connected with a grounding conductor to make it shorted, and the path length of the parallel transmission section is ½ wavelength, the input impedance $Z_{O2}$ thereof is at point T in the Smith Chart as shown in FIG. 14. If the parallel transmission section is not connected with the grounding conductor (that is, not shorted), but is left open, the input impedance $Z_{O2}$ thereof becomes infinite and is at location P in the Smith Chart. If the path length is changed by ¼ wavelength, the input impedance $Z_{O2}$ moves along the circle in the Smith Chart by π (radian). By the way, when the path length is changed by ½ wavelength, the input impedance $Z_{02}$ moves along the circle in the Smith Chart by 2π (radian), returning to the starting position. Therefore, if the parallel transmission section is left open, and the path length is set to be ¼ wavelength, the input impedance $Z_{O2}$ thereof is at point T in the Smith Chart. By setting the path length of the parallel transmission section 1930 to be ¼ wavelength, the parallel transmission section 1930 is shorter than the case of a ½ wavelength path length, and thus it is possible to make the signal switching device compact.

Figure 29:
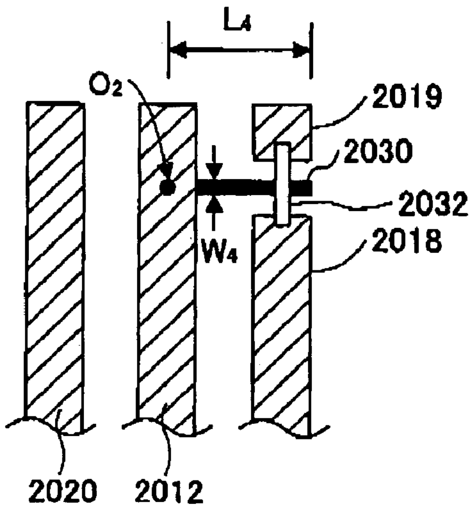
FIG. 29 is a plan view of a portion of a signal switching device as a modification to the sixth embodiment of the present invention.

FIG. 29 is a plan view of a portion of a signal switching device 2000 as a modification to the sixth embodiment of the present invention. Similar to FIG. 28, FIG. 29 illustrates the second transmission section and the parallel transmission section described in the previous embodiments. In FIG. 28, the strip conductor 2012 is provided at specified distances from grounding conductors 2018, 2019, and 2020. A parallel transmission section 2030 is provided with one end thereof in connection with the strip conductor 2012, and the other end thereof being open. The parallel transmission section 2030 has a path width w4 and a path length equal to ¼ wavelength of the input signals, or in general, an odd multiple of ¼ of the wavelength. By setting the path length of the parallel transmission section 2030 in this way, the input impedance $Z_{O2}$ to the parallel transmission section 2030 is substantially zero when the parallel transmission section 2030 is in the superconducting state.

In the present embodiment, the grounding conductors 2018 and 2019 are not an integral conductor enclosing the parallel transmission section 2030, but separated from each other. In order to maintain the potentials of the grounding conductors 2018 and 2019 to be equal, the grounding conductors 2018 and 2019 are electrically connected by a bridge 2032.

Similar to the signal switching device 1900 shown in FIG. 28, by setting the path length of the parallel transmission section 2030 to be ¼ wavelength, the parallel transmission section 2030 is shorter than the case of a ½ wavelength path length, and thus it is possible to make the signal switching device compact.

In the above embodiments, it is described that the normal conducting materials and the superconducting materials are formed on a dielectric material. It should be noted that this is not an indispensable requirement. For example, it is possible to fabricate a signal switching device by making use of a material obtained by forming a superconducting material layer on an entire surface of a dielectric material, and then forming a normal conducting material layer on the superconducting material layer, and further patterning the normal conducting material layer. In doing so, in a switching device in which a desired transmission path is selected by setting the temperature of the superconducting material of transmission path below its critical temperature, if a desired transmission path is selected, very low signal loss can be achieved.

In addition, in the above embodiments, it is described that the parallel transmission section 130, 730, 1030, 1430, 1730, 1830, 1930, or 2030 has a path length equal to ½ or ¼ the wavelength of the input signal. However, the present invention is not limited to this configuration, and other values of the path length may also be used provided that the path length meets certain requirements. For example, (1), the input impedance $Z_{O2}$ of the parallel transmission section is substantially infinite when the parallel transmission section is in the non-superconducting state, (2), the input impedance $Z_{O2}$ of the parallel transmission section is substantially zero when the parallel transmission section is in the superconducting state, and (3), the path length should be as short as possible. Therefore, for example, it is possible to set the path length of the parallel transmission section shorter than ¼ the wavelength of the input signals. Nevertheless, from the point of view of making the input impedance $Z_{O2}$ close to the short point T or the open point P as much as possible, it is preferable to set the path length of the parallel transmission section to be a multiple of ½ or an odd multiple of ¼ the wavelength of the input signals.

According to the above embodiments, by providing a parallel transmission section formed from a superconducting material in the transmission paths it is possible to appropriately change the signal transmission path to the subsequent circuits, without using mechanical switches or semiconductor switches as in the related art.

Further, because of the serial transmission section and the parallel transmission section, when switching the input signals to the first transmission path, both the serial transmission section and the parallel transmission section are in the superconducting state. Because the length of the second transmission section is determined so that the input impedance to the second transmission section is sufficiently large, input signals propagate to the first transmission path, without signal loss to the second transmission path.

When switching the input signals to the second transmission path, the serial transmission section and the parallel transmission section are both in the non-superconducting state. Therefore, the impedance of the first transmission path is very large, and input signals propagate to the second transmission path without signal loss to the first transmission path. Further, because the cross section of the parallel transmission section is very small, the impedance to the parallel transmission section is very large, hence the signals propagating in the second transmission section continue to propagate to the circuits connected to the second transmission section without signals branched by the parallel transmission section. Consequently, a good isolation characteristic can be achieved, and signal loss occurring in the either transmission path can be reduced effectively.

While the present invention is described above with reference to specific embodiments chosen for purpose of illustration, it should be apparent that the invention is not limited to these embodiments, but numerous modifications could be made thereto by those skilled in the art without departing from the basic concept and scope of the invention.

Summarizing the effect of the invention, it is possible to provide a signal switching device capable of transmitting signals with lower signal loss while maintaining a good isolation characteristic. Further, a switching element like a mechanical switch or a semiconductor switch is not needed any longer.

This patent application is based on Japanese Priority Patent Application No. 2002-324422 filed on Nov. 7, 2002, and Japanese Priority Patent Application No. 2003-015351 filed on Jan. 23, 2003, the entire contents of which are hereby incorporated by reference.

What is claimed is:

1. A signal switching device including a plurality of transmission paths to an input path, said signal switching device outputting a signal from the input path through one of the transmission paths, comprising:

a first variable impedance unit connected to a first transmission path in series, said first variable impedance unit including a first section formed from a superconducting material; and a second variable impedance unit provided on a second transmission path in parallel to a signal line of the second transmission path, said second variable impedance unit including a second section formed from a superconducting material, an area of a cross section of said second section being less than an area of a cross section of the signal line of the second transmission path, a length of the signal line of the second transmission path being determined in such a way that an input impedance of the second transmission path is greater than a predetermined value when the second section is in a superconducting state.

2. The signal switching device as claimed in claim 1, wherein when the second section is in a superconducting state, a length of the second section is adjusted so that an input impedance from the second transmission path to the second section is less than a predetermined value.

3. The signal switching device as claimed in claim 2, wherein an end of the second section is connected to the second transmission path, and another end of the second section is grounded.

4. The signal switching device as claimed in claim 3, wherein the length of the second section equals half of a wavelength of the signal, or a multiple of half of the wavelength of the signal.

5. The signal switching device as claimed in claim 2, wherein an end of the second section is connected to the second transmission path, and other end of the second section is open; and the length of the second section equals a quarter of a wavelength of the signal or an odd multiple of a quarter of the wavelength of the signal.

6. The signal switching device as claimed in claim 1, further comprising a selection unit configured to select one of the first transmission path and the second transmission path as the transmission path through which the signal is to be output by changing conduction states of the superconducting material of the first section and the superconducting material of the second section.

7. The signal switching device as claimed in claim 1, further comprising:

a third variable impedance unit connected to a third transmission path in series, said third variable impedance unit including a third section formed from a superconducting material; and a fourth variable impedance unit provided on the third transmission path in parallel to a signal line of the third transmission path, said fourth variable impedance unit including a fourth section formed from a superconducting material, an area of a cross section of said fourth section being less than an area of a cross section of the signal line of the third transmission path, a length of the signal line of the third transmission path being determined in such a way that an input impedance of the third transmission path is greater than a predetermined value when the fourth section is in a superconducting state.

8. The signal switching device as claimed in claim 7, wherein when the fourth section is in a superconducting state, a length of the fourth section is adjusted so that an input impedance from the third transmission path to the fourth section is less than a predetermined value.

9. The signal switching device as claimed in claim 8, wherein an end of the fourth section is connected to the third transmission path, and another end of the fourth section is grounded.

10. The signal switching device as claimed in claim 9, wherein the length of the fourth section equals half of a wavelength of the signal, or a multiple of half of the wavelength of the signal.

11. The signal switching device as claimed in claim 8, wherein an end of the fourth section is connected to the third transmission path, and another end of the fourth section is open; and the length of the fourth section equals a quarter of a wavelength of the signal or an odd multiple of a quarter of the wavelength of the signal.

12. The signal switching device as claimed in claim 7, further comprising a selection unit configured to select one of the first transmission path, the second transmission path and the third transmission path as the transmission path through which the signal is to be output by changing conduction states of the superconducting material of the first section, the superconducting material of the second section, the superconducting material of the third section, and the superconducting material of the fourth section.

* * * * *